(12) United States Patent
Cho et al.

(10) Patent No.: US 12,166,132 B2
(45) Date of Patent: Dec. 10, 2024

(54) SEMICONDUCTOR DEVICE

(71) Applicant: Samsung Electronics Co., Ltd., Suwon-si (KR)

(72) Inventors: Minhee Cho, Suwon-si (KR); Mintae Ryu, Hwaseong-si (KR); Sungwon Yoo, Hwaseong-si (KR); Wonsok Lee, Suwon-si (KR); Hyunmog Park, Seoul (KR); Kiseok Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 457 days.

(21) Appl. No.: 17/690,371

(22) Filed: Mar. 9, 2022

(65) Prior Publication Data

US 2023/0009575 A1 Jan. 12, 2023

(30) Foreign Application Priority Data

Jul. 8, 2021 (KR) .......................... 10-2021-0089939

(51) Int. Cl.
*H01L 29/786* (2006.01)

(52) U.S. Cl.
CPC .. *H01L 29/78642* (2013.01); *H01L 29/78618* (2013.01); *H01L 29/78696* (2013.01)

(58) Field of Classification Search
CPC ......... H01L 29/78642; H01L 29/78618; H01L 29/78696; H01L 29/7869; H01L 21/823487; H01L 21/8221; H01L 21/823418; H01L 21/823481; H10B 12/315

See application file for complete search history.

(56) References Cited

U.S. PATENT DOCUMENTS

| 8,344,437 B2 | 1/2013 | Kim et al. |
| 8,975,689 B1 | 3/2015 | Kim et al. |
| 9,705,001 B2 | 7/2017 | Yamazaki |

(Continued)

FOREIGN PATENT DOCUMENTS

| CN | 102446919 A | 5/2012 |
| KR | 10-2015-0129825 A | 11/2015 |

(Continued)

OTHER PUBLICATIONS

Taiwanese Office Action dated Apr. 26, 2023 issued in corresponding Taiwanese Patent Application No. 111120488.

*Primary Examiner* — David Vu
(74) *Attorney, Agent, or Firm* — Harness, Dickey & Pierce, P.L.C.

(57) ABSTRACT

A semiconductor device including a conductive line on a substrate, a first gate electrode on the conductive line, a second gate electrode separated by a gate isolation insulating layer on the first gate electrode, a first channel layer on a side surface of the first gate electrode, with a first gate insulating layer therebetween, a first source/drain region on another side surface of the first gate electrode, a second channel layer on another side surface of the second gate electrode on a side that is opposite to the first channel layer, with a second gate insulating layer therebetween, a second source/drain region on the second channel layer, and a third source/drain region on the first channel layer and on a side surface of the second gate electrode on a same side as the first channel layer may be provided.

20 Claims, 42 Drawing Sheets

(56) References Cited

U.S. PATENT DOCUMENTS

| | | | |
|---|---|---|---|
| 9,773,888 B2* | 9/2017 | Pulugurtha | H01L 29/7827 |
| 10,714,400 B2 | 7/2020 | Torek | |
| 2015/0056801 A1 | 2/2015 | Park et al. | |
| 2015/0348976 A1* | 12/2015 | Moon | H01L 29/105 |
| | | | 438/270 |
| 2017/0047421 A1 | 2/2017 | Oh et al. | |
| 2017/0125554 A1 | 5/2017 | Colinge et al. | |
| 2019/0296155 A1 | 9/2019 | Sawabe et al. | |
| 2020/0006575 A1 | 1/2020 | Dewey et al. | |
| 2020/0111908 A1 | 4/2020 | Sills et al. | |
| 2020/0203345 A1 | 6/2020 | Matsuzaki et al. | |
| 2020/0335635 A1 | 10/2020 | Sharma et al. | |
| 2020/0381557 A1 | 12/2020 | Hattori et al. | |

FOREIGN PATENT DOCUMENTS

| | | |
|---|---|---|
| KR | 10-2020-0036951 A | 4/2020 |
| TW | 201513230 A | 4/2015 |

\* cited by examiner

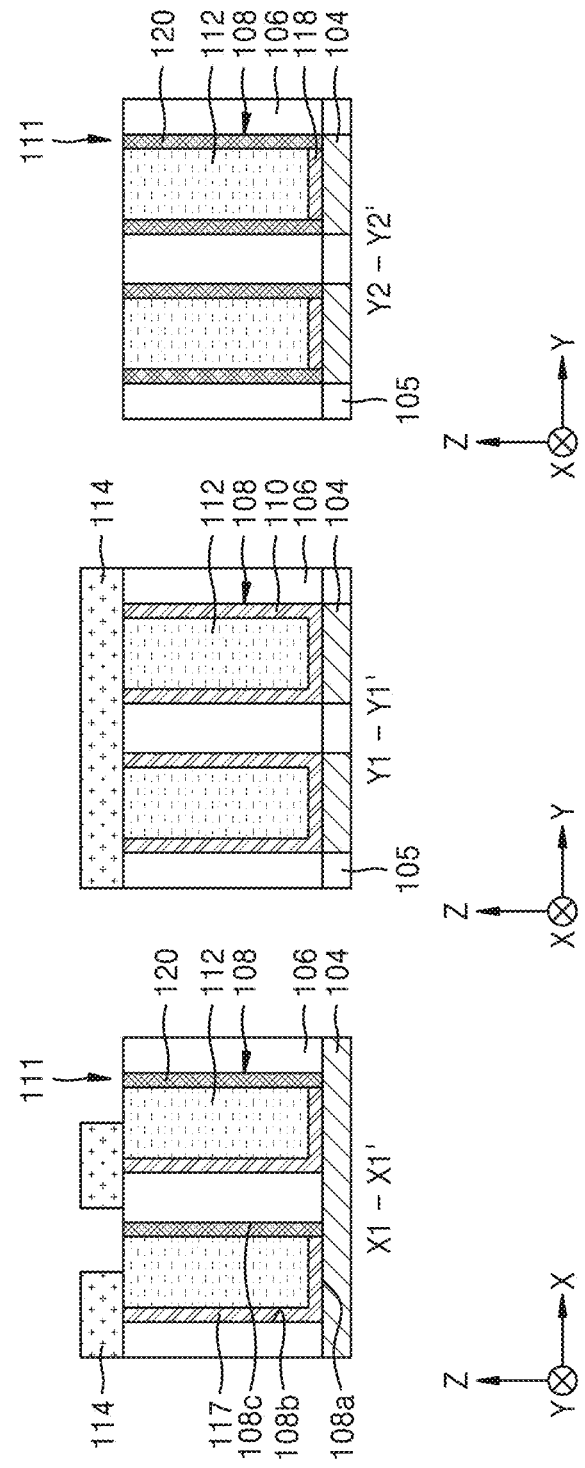

SEMICONDUCTOR DEVICE

CROSS-REFERENCE TO RELATED APPLICATION

This application is based on and claims priority under 35 U.S.C. § 119 to Korean Patent Application No. 10-2021-0089939, filed on Jul. 8, 2021, in the Korean Intellectual Property Office, the disclosure of which is incorporated by reference herein in its entirety.

BACKGROUND

The inventive concepts relate to semiconductor devices, and more particularly, to semiconductor devices having a vertical channel transistor (VCT).

A semiconductor device (or an integrated circuit device) may include a plurality of transistors. With the development of the semiconductor industry, semiconductor devices including transistors are becoming highly integrated, that is, miniaturized. A highly integrated semiconductor device requires a vertical channel transistor (VCT) vertically provided on a semiconductor substrate rather than a planar channel transistor planarly provided on the semiconductor substrate. It may be difficult to form the vertical channel transistor (VCT) with high reliability.

SUMMARY

The inventive concepts provide semiconductor devices including a high-reliability vertical channel transistor (VCT).

According to an example embodiment of the inventive concepts, a semiconductor device may include a conductive line on a substrate, a first gate electrode on the conductive line, a second gate electrode on the first gate electrode, the second gate electrode separated from the first gate electrode by a gate isolation insulating layer, a first channel layer on a first side surface of the first gate electrode, with a first gate insulating layer interposed therebetween, a first source/drain region on a second side surface of the first gate electrode, a second channel layer on a third side surface of the second gate electrode with a second gate insulating layer interposed therebetween, the third side surface being opposite to the first side surface, a second source/drain region on the second channel layer, and a third source/drain region on the first channel layer and on a fourth side surface of the second gate electrode, the fourth side surface being on a same side as the first channel layer.

According to another aspect of the inventive concepts, a semiconductor device may include a conductive line on a substrate, a first gate electrode in a device isolation trench on the conductive line, a second gate electrode on the first gate electrode in the device isolation trench, the second gate electrode separated from the first gate electrode by a gate isolation insulating layer, a first channel layer on a bottom surface and a first isolation side surface of the device isolation trench, the first channel layer being on a first gate side surface of the first gate electrode with a first gate insulating layer interposed therebetween, a first source/drain region on a second isolation side surface of the device isolation trench and the first source/drain region being on a second gate side surface of the first gate electrode, a second channel layer on the second isolation side surface of the device isolation trench, the second channel layer being on a third gate side surface of the second gate electrode with a second gate insulating layer interposed therebetween, the third gate side surface being 1 opposite side to the first gate side surface, a second source/drain region on the second isolation side surface of the device isolation trench and on the second channel layer, and a third source/drain region on the first isolation side surface of the device isolation trench, the third source/drain region being on a fourth gate side surface of the second gate electrode, the fourth gate side surface being on a same side as the first channel layer, and the third source/drain region being on the first channel layer.

According to another aspect of the inventive concepts, a semiconductor device may include a first conductive line extending in a first direction on a substrate, a second conductive line on the first conductive line and extending in a second direction perpendicular to the first direction, the second conductive line comprising a first sub-gate line and a second sub-gate line, the first sub-gate line comprising a first gate electrode, the second sub-gate line comprising a second gate electrode, the second gate electrode separated from the first gate electrode by a gate isolation insulating layer, a first vertical channel transistor on a first side of the second conductive line, and a second vertical channel transistor on a second side of the second conductive line. The first vertical channel transistor may include a first channel layer on a first gate side surface of the first gate electrode with a first gate insulating layer interposed therebetween, a third source/drain region on the first channel layer and on a first gate side surface of the second gate electrode, the first gate side surface of the second gate electrode being on a same side as the first channel layer. The second vertical channel transistor may include a second channel layer on a second gate side surface of the second gate electrode with a second gate insulating layer interposed therebetween, the second gate side surface of the second gate electrode being opposite to the first channel layer, a first source/drain region on a second gate side surface of the first gate electrode, and a second source/drain region on the second channel layer.

The first vertical channel transistor includes a first channel layer on one side surface of the first gate electrode with a first gate insulating layer therebetween and a third source/drain region on the first channel layer and on an upper portion of one side surface (or on a side surface) of the second gate electrode, the one side being on a same side as the first channel layer. The second vertical channel transistor includes a second channel layer formed on another side surface of the second gate electrode with a second gate insulating layer therebetween, the another side surface of the second gate electrode being opposite to the first channel layer, a first source/drain region on an upper portion of another side surface of the first gate electrode, and a second source/drain region on the second channel layer.

BRIEF DESCRIPTION OF THE DRAWINGS

Example embodiments of the inventive concepts will be more clearly understood from the following detailed description taken in conjunction with the accompanying drawings in which:

FIGS. 11A through 25A are layout diagrams for describing a method of manufacturing a semiconductor device according to an example embodiment of the inventive concepts;

FIGS. 11B through 25B are cross-sectional views for describing a method of manufacturing a semiconductor device according to an example embodiment of the inventive concepts.

DETAILED DESCRIPTION

Hereinafter, some example embodiments of the inventive concepts will be described in detail with reference to the accompanying drawings. The following example embodiments of the inventive concepts may be implemented with any one thereof, and the following example embodiments may be implemented in combination of one or more thereof. Thus, the technical spirit of the inventive concepts should not be construed as being limited to one example embodiment.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Herein, singular forms of components may include plural forms unless the context clearly indicates otherwise. In this specification, the drawings may be exaggerated in order to more clearly describe the inventive concepts.

Figure 1:
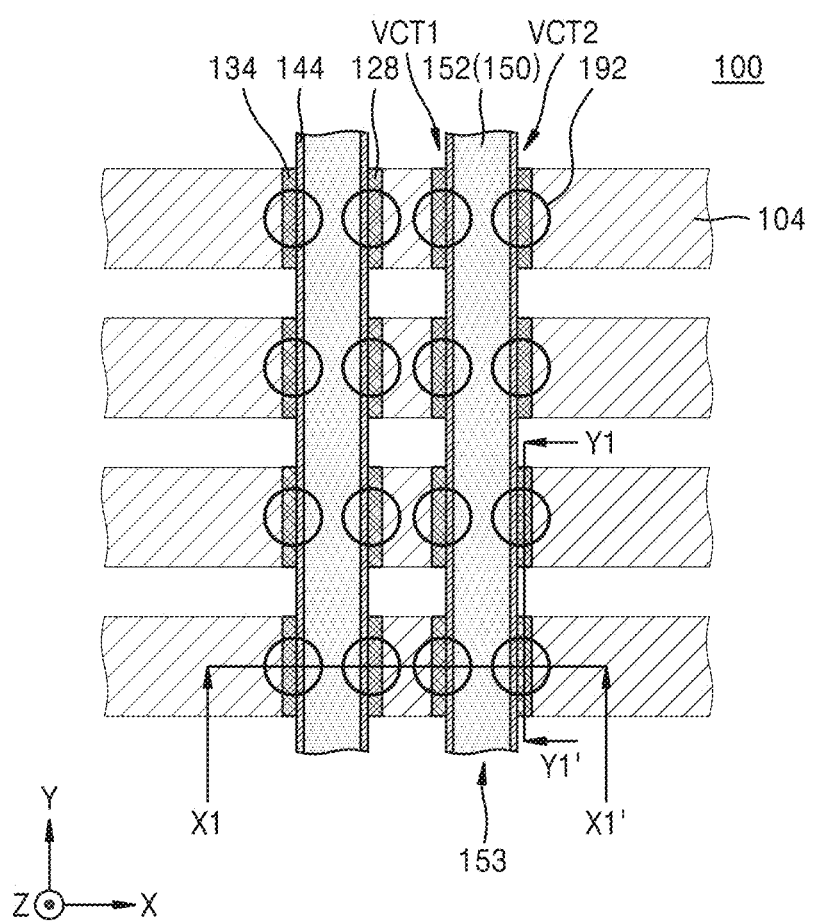
FIG. 1 is a layout diagram of a semiconductor device according to an example embodiment of the inventive concepts.
Figure 2:
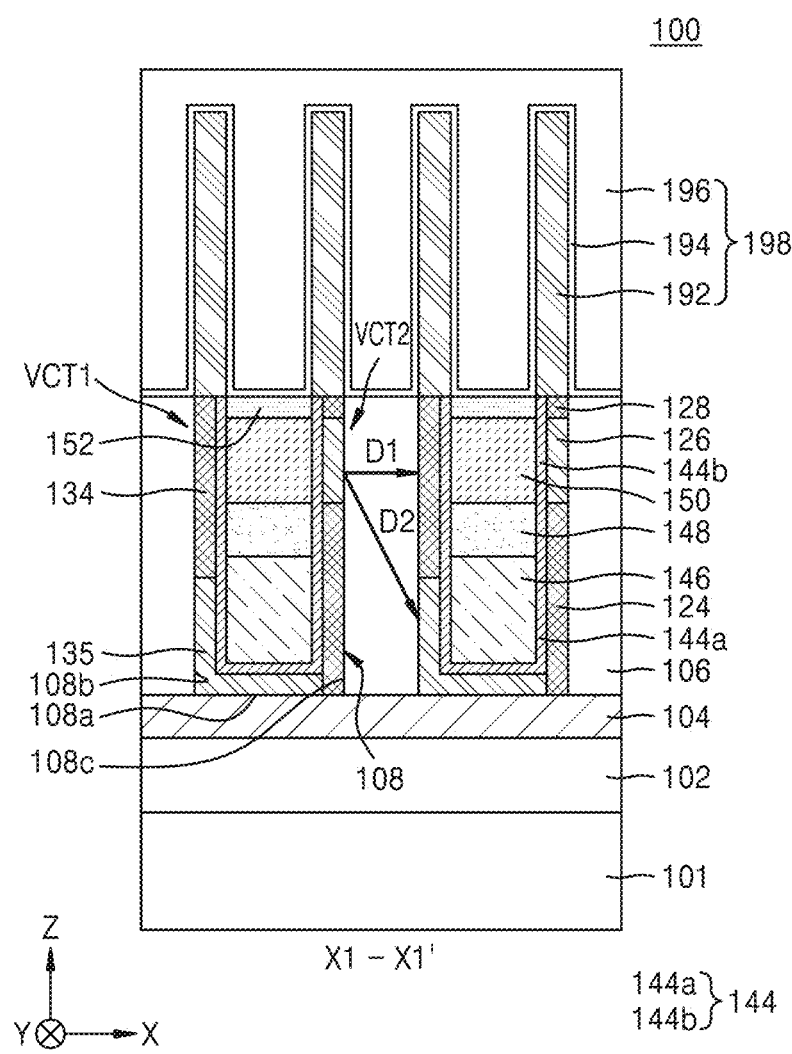
FIG. 2 is a cross-sectional view cut along a line X1-X1' of FIG. 1.
Figure 3:
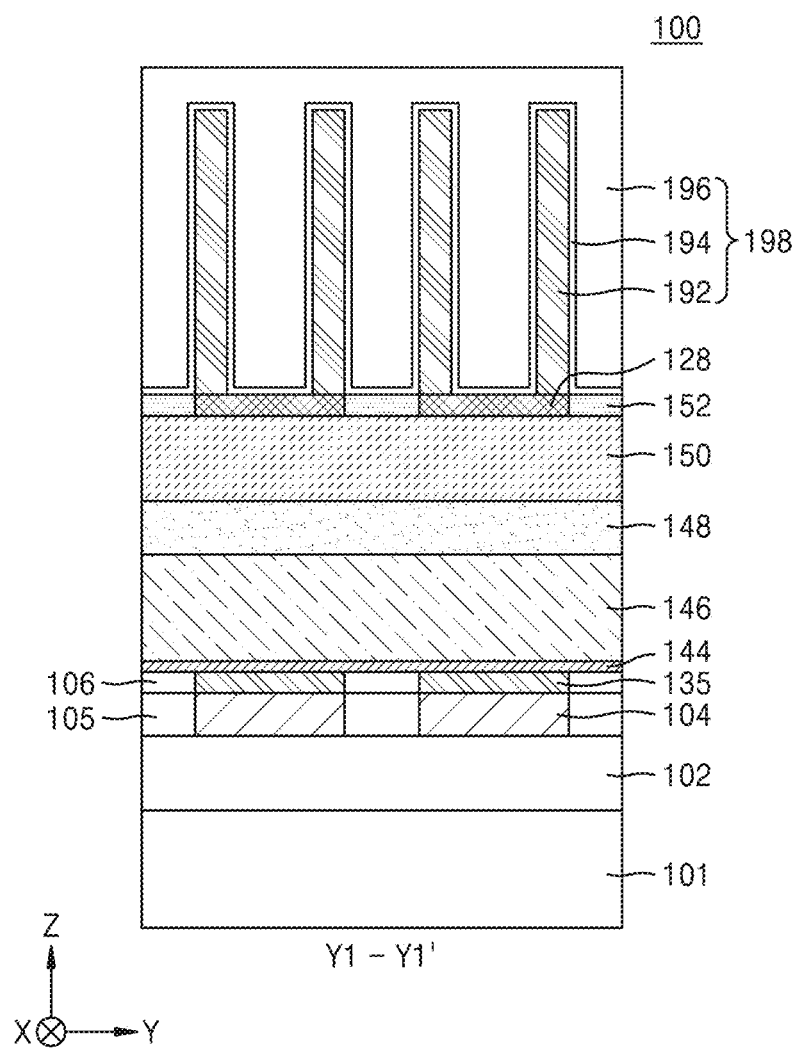
FIG. 3 is a cross-sectional view cut along a line Y1-Y1' of FIG. 1.

FIG. 1 is a layout diagram of a semiconductor device according to an example embodiment of the inventive concepts, FIG. 2 is a cross-sectional view cut along a line X1-X1' of FIG. 1, and FIG. 3 is a cross-sectional view cut along a line Y1-Y1' of FIG. 1.

For example, a semiconductor device 100 may include a substrate 101, a plurality of first conductive lines 104, a first channel layer 135, a second channel layer 126, a first gate electrode 146, a second gate electrode 150, a first source/drain region 124, a second source/drain region 128, a third source/drain region 134, a plurality of second conductive lines 153, and a capacitor structure 198.

The semiconductor device 100 may be referred to as an integrated circuit device. The semiconductor device 100 may be a memory device including a vertical channel transistor (VCT). The semiconductor device 100 may be a dynamic random-access memory (DRAM) device. The VCT may mean a structure in which channel lengths of the first channel layer 135 and the second channel layer 126 extend from the substrate 101 in a vertical direction, (e.g., a Z direction).

A lower insulating layer 102 may be disposed on the substrate 101. The substrate 101 may be a semiconductor substrate (e.g., a silicon substrate). On the lower insulating layer 102, a plurality of first conductive lines 104 may be apart from each other in a second direction (a Y direction) and extend in a first direction (an X direction) perpendicular to the second direction (the Y direction).

The plurality of first conductive lines 104 may function as bit lines of the semiconductor device 100. In some example embodiments, the plurality of first conductive lines 104 may include doped polysilicon, metal, conductive metal nitride, conductive metal silicide, conductive metal oxide, or a combination thereof.

For example, the plurality of first conductive lines 104 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not limited thereto. The plurality of first conductive lines 104 may include a single layer or layers of the materials described above. In some example embodiments, the plurality of first conductive lines 104 may include a two-dimensional semiconductor material that may include, for example, graphene, carbon nanotube, or a combination thereof.

The semiconductor device 100 may include a plurality of second conductive lines 153 arranged to extend in the second direction perpendicular to the first direction (the X direction) on the first conductive lines 104. The second conductive lines 153 may function as word lines of the semiconductor device 100. The second conductive lines 153 may use a material used in the first conductive lines 104.

In some example embodiments, the second conductive lines 153 may include doped polysilicon, metal, conductive metal nitride, conductive metal silicide, conductive metal oxide, or a combination thereof. In some example embodiments, the second conductive lines 153 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not limited thereto.

A first vertical channel transistor VCT1 may be disposed on one side of the second conductive lines 153, and a second vertical channel transistor VCT2 may be disposed on the other side of the second conductive lines 153. Configurations of the first vertical channel transistor VCT1 and the second vertical channel transistor VCT2 will be described in more detail below.

The first vertical channel transistor VCT1 and the second vertical channel transistor VCT2 may be formed in a device isolation trench 108 of a device isolation insulating layer 106 on the first conductive lines 104, as shown in FIG. 2. The device isolation trench 108 may be referred to as a device isolation hole. The device isolation insulating layer 106 may include a silicon oxide layer or a silicon nitride layer. The device isolation insulating layer 106 may also be referred to as a transistor isolation insulating layer.

The second conductive lines 153 may include a first gate electrode 146 and a second gate electrode 150 separated by a gate isolation insulating layer 148 on the first gate electrode 146. One side surface of the first gate electrode 146 and one side surface of the second gate electrode 150 may be in the same vertical plane in a direction perpendicular to the surface of the substrate 101, that is, in a third direction (e.g., the Z direction). The other side surface of the first gate electrode 146 and the other side surface of the second gate electrode 150 may be in the same vertical plane in the direction perpendicular to the surface of the substrate 101, that is, in the Z direction.

In the semiconductor device 100, the first gate electrode 146 and the second gate electrode 150 may function as word lines. When the second gate electrode 150 is stacked on the first gate electrode 146 and heights (or thicknesses) of the first gate electrode 146 and the second gate electrode 150 and an area between the first gate electrode 146 and the second gate electrode 150 are adjusted, resistivity or capacitance may be reduced. Thus, the semiconductor device 100 may reduce a resistance-capacitance (RC) delay of a word line.

The gate isolation insulating layer 148 may include a silicon oxide layer or a silicon insulating layer. As described below, the first gate electrode 146 may constitute a first sub-gate line (or a first word line), and the second gate electrode 150 may constitute a second sub-gate line (or a second word line).

A first channel layer 135 may be formed on one side surface of the first gate electrode 146, with a first gate insulating layer 144a therebetween. The first channel layer 135 may be formed on a bottom 108a and one side surface 108b of the device isolation trench 108. The first channel layer 135 may be formed on a portion of the bottom 108a of the device isolation trench 108 and a portion of the side surface 108b of the device isolation trench 108.

In a Y-Y' line cross-section perpendicular to the first conductive lines 104 shown in FIG. 3, the first channel layer 135 may be positioned on the first conductive lines 104. An insulating pattern 105 on the lower insulating layer 102 may be disposed to fill a space between the plurality of first conductive lines 104. The first conductive lines 104 and the first channel layer 135 may be separated by the device isolation insulating layer 106. A gate insulating layer 144 may be formed on the first channel layer 135 and the device isolation insulating layer 106.

The first channel layer 135 may be disposed apart in the first direction (the X direction) on the plurality of first conductive lines 104. In some example embodiments, the first channel layer 135 may include an oxide semiconductor layer. For example, the oxide semiconductor layer may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or a combination thereof.

The first channel layer 135 may include a single layer or layers of an oxide semiconductor layer. In some examples, the first channel layer 135 may have a bandgap energy greater than that of silicon. The first channel layer 135 may have a bandgap energy of about 1.5 eV to about 5.6 eV. The first channel layer 135 may have optimal channel performance when the first channel layer 135 has a bandgap energy of about 2.0 eV to about 4.0 eV.

The first channel layer 135 may be polycrystalline or amorphous, without being limited thereto. In some example embodiments, the first channel layer 135 may include a two-dimensional (2D) semiconductor material, and, for example, the 2D semiconductor material may include graphene, carbon nanotube, or a combination thereof.

The first source/drain region 124 may be formed on an upper portion of the other side surface of the first gate electrode 146. The first source/drain region 124 may be formed on the other side surface of the first gate electrode 146, with the first gate insulating layer 144a interposed therebetween. The first source/drain region 124 may be formed on the other side surface 108c of the device isolation trench 108. The first source/drain region 124 may be formed on a portion of the other side surface 108c of the device isolation trench 108. The first source/drain region 124 may include a conductive layer. The conductive layer constituting the first source/drain region 124 may use the same material as used in the first conductive line 104.

The second channel layer 126 may be formed on the other side surface of the second gate electrode 150, with a second gate insulating layer 144b interposed therebetween, and may be opposite to the first channel layer 135. The second channel layer 126 may be formed on the other side surface 108c of the device isolation trench 108. The second channel layer 126 may be formed using the same material as used in the first channel layer 135 described above. The second source/drain region 128 may be formed on the second channel layer 126.

The second source/drain region 128 may be formed on the other side surface of the second gate electrode 150, with the second gate insulating layer 144b interposed therebetween. The second source/drain region 128 may be formed on the other side surface 108c of the device isolation trench 108. The second source/drain region 128 may be formed on a portion of the other side surface 108c of the device isolation trench 108.

The third source/drain region 134 may be formed on the first channel layer 135 and an upper portion of the one side surface of the second gate electrode 150 on the same side as the first channel layer 135. The third source/drain region 134 may be formed on the one side surface of the second gate electrode 150, with the second gate insulating layer 144b interposed therebetween. The third source/drain region 134 may be formed on the side surface 108b of the device isolation trench 108. The third source/drain regions 134 may be formed on a portion of the side surface 108b of the device isolation trench 108.

The first gate insulating layer 144a and the second gate insulating layer 144b may be referred to as the gate insulating layer 144. The first gate insulating layer 144a and the second gate insulating layer 144b may be formed as a one integral body. In some example embodiments, the gate insulating layer 144 may include a silicon oxide film, a silicon oxynitride film, a high-dielectric film having a higher dielectric constant than that of the silicon oxide film, or a combination thereof. The high-dielectric film may include metal oxide or metal oxynitride. In some example embodiments, the high-dielectric film usable as the gate insulating layer 144 may include HfO$_2$, HfSiO, HfSiON, HfTaO, HfTiO, HfZrO, ZrO$_2$, Al$_2$O$_3$, or a combination thereof, without being limited thereto.

The second source/drain region 128 and the third source/drain region 134 may include a conductive layer. The conductive layer constituting the second source/drain region 128 and the third source/drain region 134 may be the same material as that of the first conductive line 104. A gate cap layer 152 may be further formed on the second gate electrode 150. The second source/drain region 128 may have the same horizontal plane as the gate cap layer 152. In other words, a top surface of the second source/drain region 128 may be coplanar with a top surface of the gate cap layer 152.

In the semiconductor device 100, the first vertical channel transistor VCT1 may include the first gate electrode 146, the first gate insulating layer 144a, the first channel layer 135, and the third source/drain region 134. The second VCT2 may include the second gate electrode 150, the second gate insulating layer 144b, the second channel layer 126, the first source/drain region 124, and the second source/drain region 128.

When the semiconductor device 100 is viewed in light of a cross-sectional structure of FIG. 2, an adjacent pair of the second channel layer 126 of the second vertical channel transistor VCT2 and the third source/drain region 134 of the first vertical channel transistor VCT1 may be apart from each other while facing each other, in a straight line direction D1. Thus, even when an electric potential (potential) is applied to the second gate electrode 150 of the second vertical channel transistor VCT2, due to the third source/drain region 134 including the conductive layer, the first vertical channel transistor VCT1 may not be affected.

In the semiconductor device 100, an adjacent pair of the second channel layer 126 of the second vertical channel transistor VCT2 and the first channel layer 135 of the first vertical channel transistor VCT1 may be farther apart from each other while facing each other, in a diagonal direction D2. Thus, when an electric potential (potential) is applied to the second gate electrode 150 of the second vertical channel transistor VCT2, the potential may not be applied to the first channel layer 135 of the first vertical channel transistor VCT1, and thus the first vertical channel transistor VCT1 may not be affected. As such, the semiconductor device 100 according to the inventive concepts may include the first and second vertical channel transistors VCT1 and VCT2 having high reliability.

In the semiconductor device 100, a capacitor structure 198 may be further formed on the first vertical channel transistor VCT1 and the second vertical channel transistor VCT2. A lower electrode 192 of the capacitor structure 198 may be formed on the second source/drain region 128 and the third source/drain region 134. The capacitor structure 198 may include the lower electrode 192, a capacitor dielectric layer 194, and an upper electrode 196. The lower electrode 192 may be formed as a pillar type extending in the third direction (the Z direction), without being limited thereto. In some example embodiments, the lower electrode 192 may be arranged in a matrix form apart in the first direction (the X direction) and the second direction (the Y direction).

Figure 4:
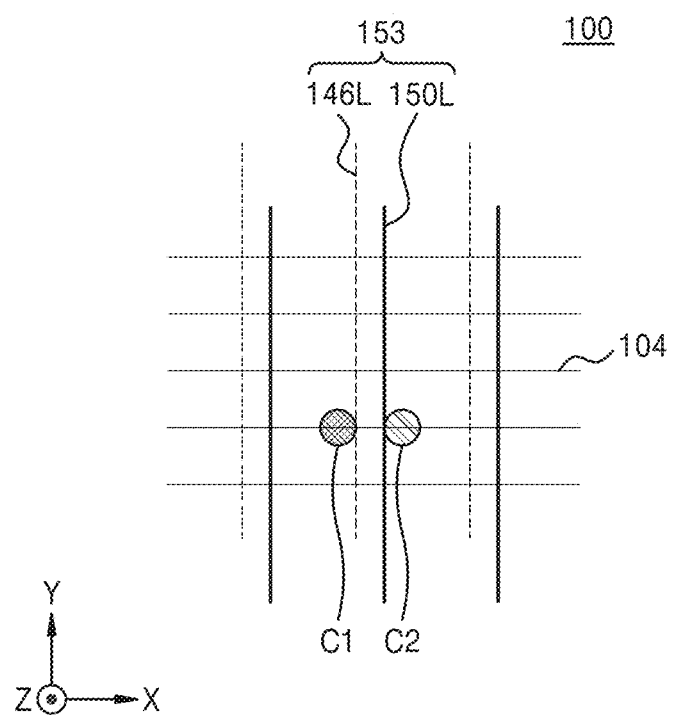
FIG. 4 is a schematic circuit diagram of a semiconductor device according to an example embodiment of the inventive concepts.

FIG. 4 is a schematic circuit diagram of a semiconductor device according to an example embodiment of the inventive concepts.

For example, the semiconductor device 100 may include the first conductive lines 104, the second conductive lines 153, a first cell C1, and a second cell C2. The plurality of first conductive lines 104 may be apart from each other in the second direction (the Y direction) and extend in the first direction (the X direction) perpendicular to the second direction (the Y direction). The first conductive lines 104 may be bit lines.

The plurality of second conductive lines 153 may be apart from each other in the first direction (the X direction) and extend in the second direction (the Y direction), on the first conductive lines 104. The second conductive lines 153 may be word lines. The second conductive lines 153 may constitute a first sub-gate line 146L (or a first word line) and a second sub-gate line 150L (or a second word line).

As described above, the first gate electrode 146 in FIGS. 2 and 3 may constitute the first sub-gate line 146L (or the first word line), and the second gate electrode 150 may constitute the second sub-gate line 150L (or the second word line).

In FIG. 4, for convenience, the first sub-gate line 146L and the second sub-gate line 150L are not shown overlappingly. The first cell C1 (e.g., a first memory cell) may be connected to the first sub-gate line 146L, and the second cell C2 (e.g., a second memory cell) may be connected to the second sub-gate line 150L. The first cell C1 may include the first vertical channel transistor VCT1 and the capacitor structure 198 described above. The second cell C2 may include the second vertical channel transistor VCT2 and the capacitor structure 198 described above. As such, in the semiconductor device 100 according to the inventive concepts, the first cell C1 and the second cell C2 may be separately connected to the first sub-gate line 146L and the second sub-gate line 150L, respectively.

Figure 5:
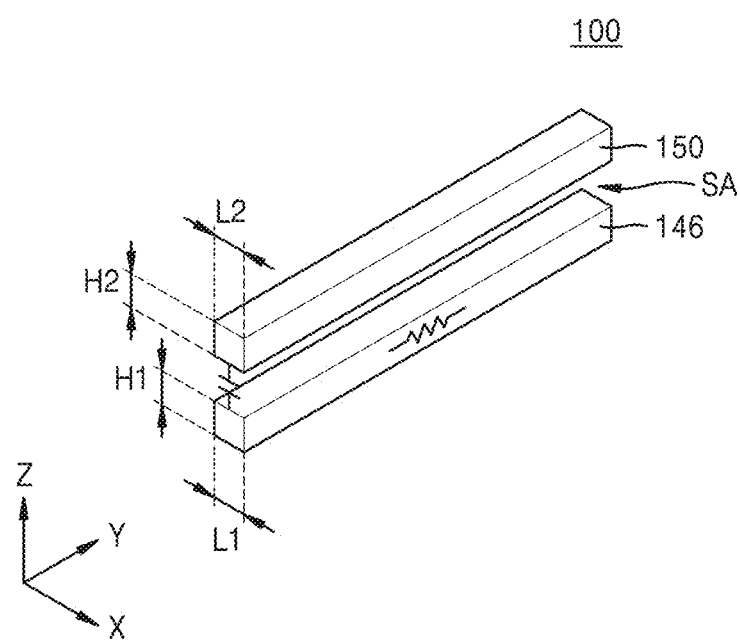
FIG. 5 is a view for describing a resistance-capacitance (RC) delay of a word line of a semiconductor device, according to an example embodiment of the inventive concepts.

FIG. 5 is a view for describing an RC delay of a word line of a semiconductor device, according to an example embodiment of the inventive concepts.

For example, in the semiconductor device 100, as described above, the first gate electrode 146 and the second gate electrode 150 may serve as word lines. On the first gate electrode 146, the second gate electrode 150 may be stacked in the third direction (the Z direction).

When a first length L1 and a first height H1 (or a first thickness) of the first gate electrode 146 and a second length L2 and a second height H2 (or a second thickness) of the second gate electrode 150 are adjusted, the resistivities of the first gate electrode 146 and the second gate electrode 150 may be reduced. In some example embodiments, when the first height H1 (or the first thickness) is greater than the first length L1 and the second height H2 (or the second thickness) is greater than the second length L2, the resistivities thereof may be reduced.

When a space area SA between the first gate electrode 146 and the second gate electrode 150 in the second direction (the Y direction) is reduced, a capacitance may be reduced. That is, when an area of the first gate electrode 146 facing the second gate electrode 150 is reduced, the capacitance may be reduced.

As such, in the semiconductor device 100 according to the inventive concepts, by adjusting the heights (H1 and H2) of the first gate electrode 146 and the second gate electrode 150, and the space area SA between the first gate electrode 146 and the second gate electrode 150, an RC delay of the word line may be reduced.

Figure 6A:
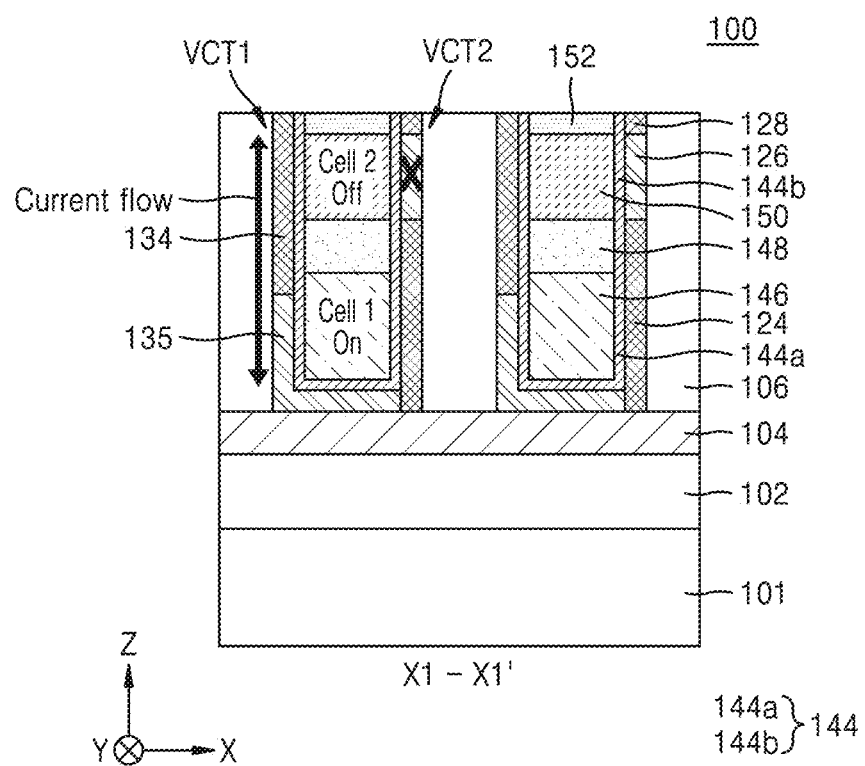
FIGS. 6A and 6B are cross-sectional views for describing an operation of a semiconductor device according to an example embodiment of the inventive concepts.
Figure 6B:
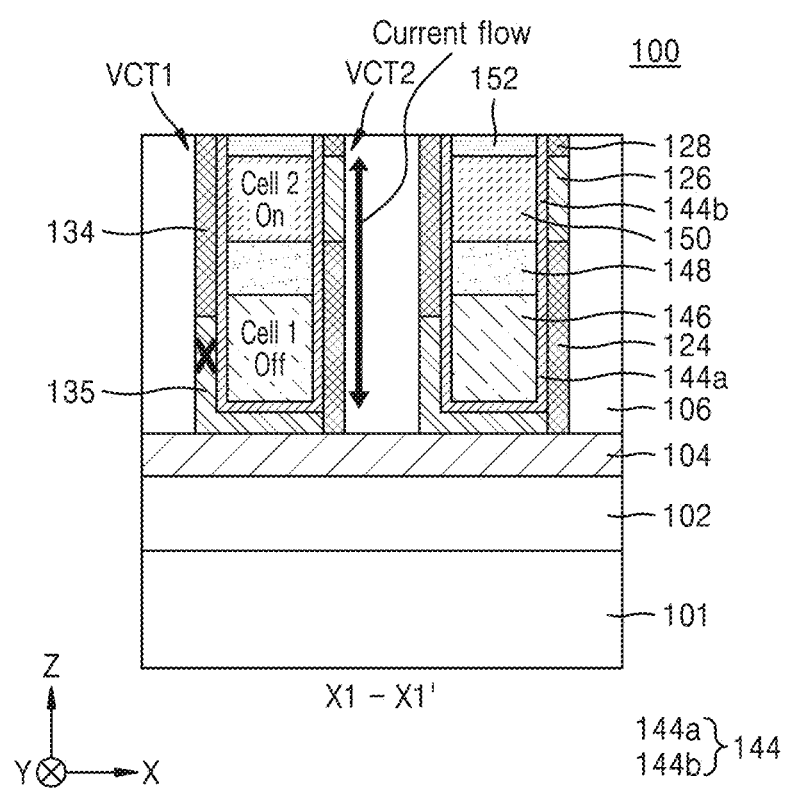

FIGS. 6A and 6B are cross-sectional views for describing an operation of a semiconductor device according to an example embodiment of the inventive concepts.

For example, FIGS. 6A and 6B are provided to describe the operation of the semiconductor device 100 of FIGS. 1 through 3. In FIGS. 6A and 6B, the same reference numerals as in FIGS. 1 through 3 denote the same members.

As shown in FIG. 6A, when an electric potential (potential) is applied to the first gate electrode 146 of the first vertical channel transistor VCT1, a current may flow from the third source/drain region 134 to the first conductive line 104 to turn on a first cell Cell 1. When an electric potential (potential) is applied to the first gate electrode 146 of the first vertical channel transistor VCT1, a current may not flow in a second cell Cell 2 of the second vertical channel transistor VCT2 to turn off the second cell Cell 2.

As shown in FIG. 6B, when an electric potential (potential) is applied to the second gate electrode 150 of the second vertical channel transistor VCT2, a current may flow from the second source/drain region 128 to the first conductive line 104 through the second source/drain region 124 to turn on the second cell Cell 2. When an electric potential (potential) is applied to the second gate electrode 150 of the second vertical channel transistor VCT2, a current may not flow in the first cell Cell 1 of the first vertical channel transistor VCT1 to turn off the first cell Cell 1.

As such, in the semiconductor device 100 according to some example embodiments of the inventive concepts, the first cell Cell 1 including the first vertical channel transistor VCT1 and the second cell Cell 2 including the second vertical channel transistor VCT2 may easily operate without mutual interference therebetween.

Figure 7:
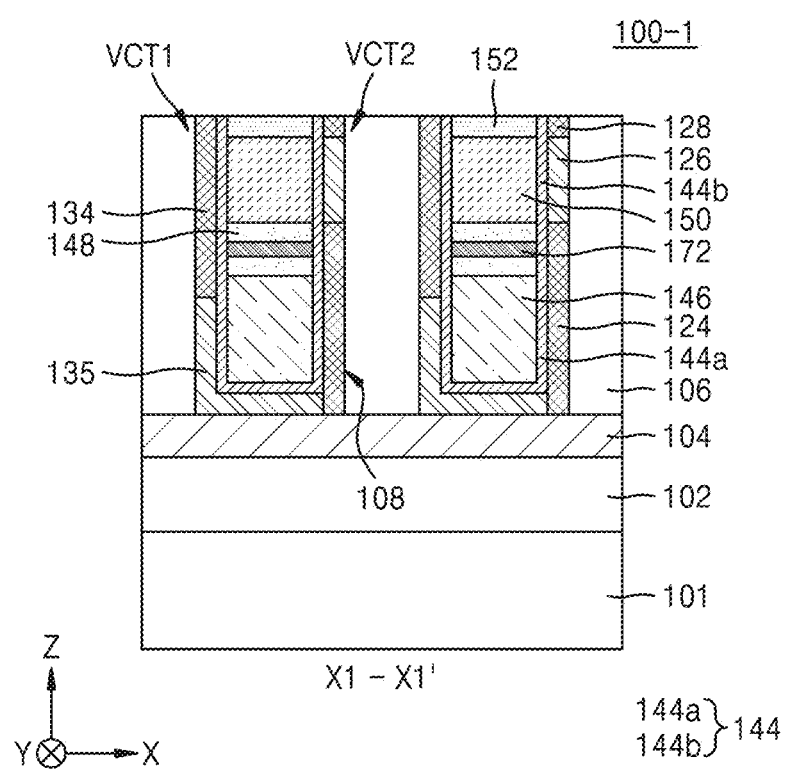
FIG. 7 is a cross-sectional view of a semiconductor device according to an example embodiment of the inventive concepts.
Figure 8:
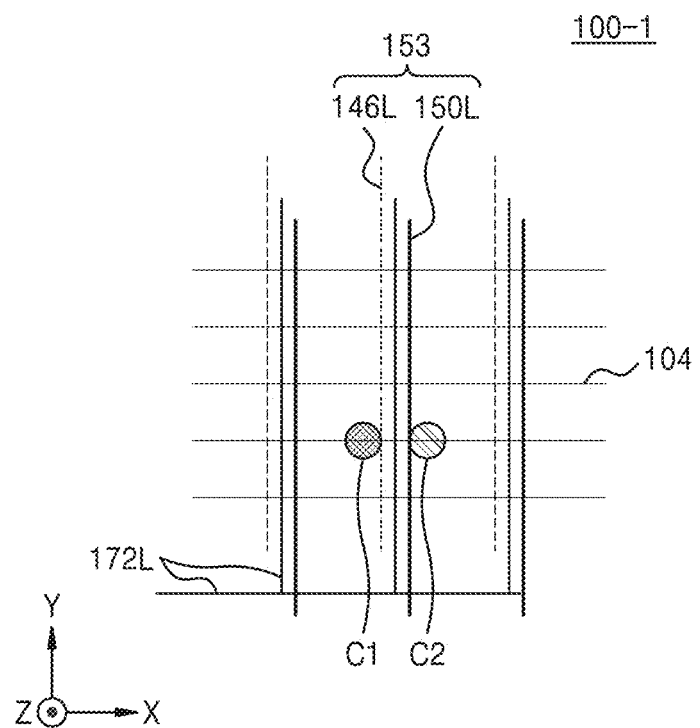
FIG. 8 is a schematic circuit diagram of a semiconductor device of FIG. 7.

FIG. 7 is a cross-sectional view of a semiconductor device according to an example embodiment of the inventive concepts, and FIG. 8 is a schematic circuit diagram of the semiconductor device of FIG. 7.

For example, a semiconductor device 100-1 of FIG. 7 may be the same as the semiconductor device 100 of FIGS. 1 through 3 except that a shielding conductive layer 172 is further formed in the gate isolation insulating layer 148.

The circuit diagram of the semiconductor device 100-1 of FIG. 8 may be the same as that of FIG. 4 except that a shielding conductive line 172L is further formed. In FIGS. 7 and 8, the same reference numerals as in FIGS. 1 through 4 denote the same members.

As shown in FIG. 7, in the semiconductor device 100-1, the shielding conductive layer 172 may be further formed in the gate isolation insulating layer 148. The shielding conductive layer 172 may be formed of the same material as the first conductive lines 104 described above. When the shielding conductive layer 172 is formed in the gate isolation insulating layer 148, the area of the gate isolation insulating layer 148 between the first gate electrode 146 and the second gate electrode 150 may be reduced, thereby reducing a capacitance.

As shown in FIG. 8, in the semiconductor device 100-1, the shielding conductive line 172L may be further positioned between the first sub-gate line 146L (or the first word line) and the second sub-gate line 150L (or the second word line) constituting the second conductive lines 153 (e.g., the word lines). Thus, the semiconductor device 100-1 may further include the shielding conductive line 172L between the first sub-gate line 146L and the second sub-gate line 150L, thereby reducing the RC relay of the second conductive lines 153, i.e., the word lines.

Figure 9:
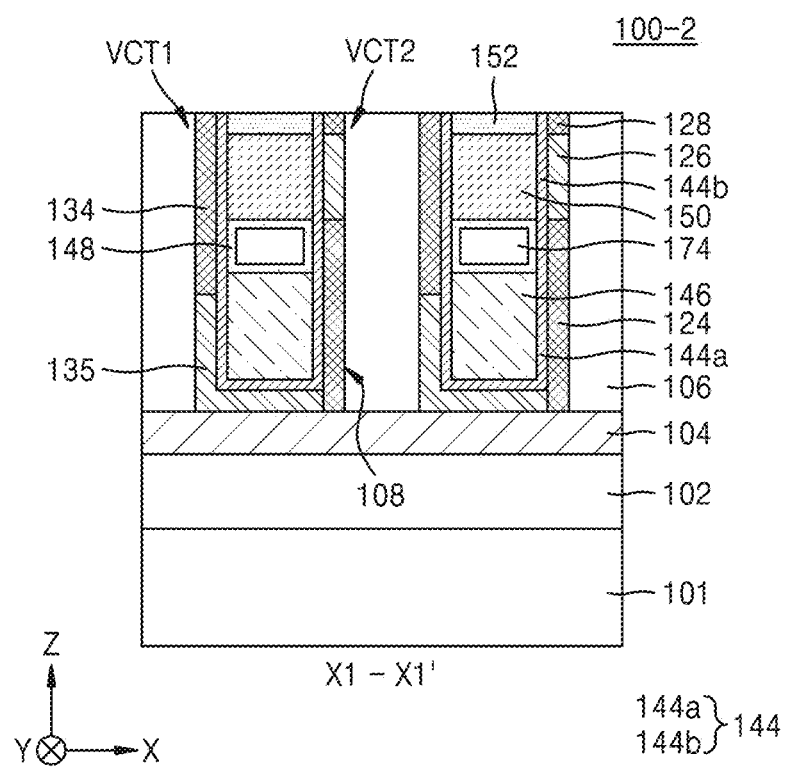
FIG. 9 is a cross-sectional view of a semiconductor device according to an example embodiment of the inventive concepts.

FIG. 9 is a cross-sectional view of a semiconductor device according to an example embodiment of the inventive concepts.

For example, a semiconductor device 100-2 of FIG. 9 may be the same as the semiconductor device 100 of FIGS. 1 through 3 except that an air layer 174 is further formed in the gate isolation insulating layer 148. In FIG. 9, the same reference numerals as in FIGS. 1 through 3 denote the same members.

As shown in FIG. 9, in the semiconductor device 100-2, the air layer 174 may be further formed in the gate isolation insulating layer 148. When the air layer 174 is formed in the gate isolation insulating layer 148, a capacitance between the first gate electrode 146 and the second gate electrode 150 may be reduced.

Thus, the semiconductor device 100-2 may reduce the RC delay of the second conductive lines (e.g., the word lines) 153 of FIGS. 1 and 4, which includes the first gate electrode 146 and the second gate electrode 150.

Figure 10:
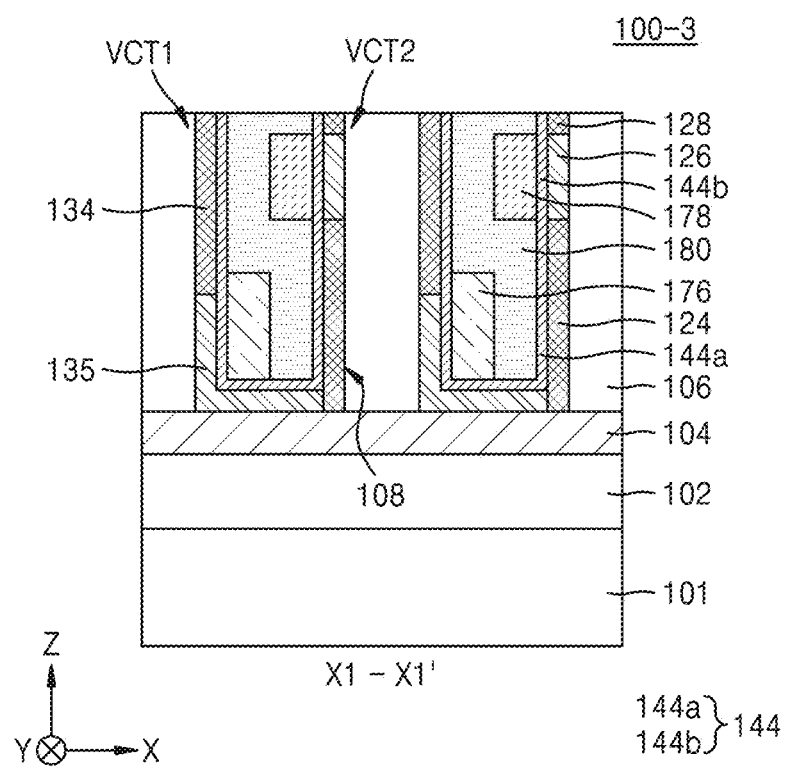
FIG. 10 is a cross-sectional view of a semiconductor device according to an example embodiment of the inventive concepts.

FIG. 10 is a cross-sectional view of a semiconductor device according to an example embodiment of the inventive concepts.

For example, a semiconductor device 100-3 of FIG. 10 may be the same as the semiconductor device 100 of FIGS. 1 through 3 except that the arrangement of the first gate electrode 176 and the second gate electrode 178 in the device isolation trench 108 is different. In FIG. 10, the same reference numerals as in FIGS. 1 through 3 denote the same members.

As shown in FIG. 10, in the semiconductor device 100-3, the first gate electrode 176 may be formed on the gate insulating layer 144 in the device isolation trench 108. On the first gate electrode 176, the second gate electrode 178 separated by the gate isolation insulating layer 180 may be formed.

The second gate electrode 178 may be positioned/spaced apart from (e.g., offset with respect to) the first gate electrode 176 along an extension direction of the first conductive lines 104. The second gate electrode 178 may not overlap the first gate electrode 176 in the third direction (the Z direction) perpendicular to the substrate 101.

As such, in the semiconductor device 100-3, by freely adjusting the arrangement of the first gate electrode 176 and the second gate electrode 178 in the device isolation trench 108, design freedom may be increased.

FIGS. 11A through 25A are layout diagrams for describing a method of manufacturing a semiconductor device according to an example embodiment of the inventive concepts, and FIGS. 11B through 25B are cross-sectional views for describing a method of manufacturing a semiconductor device according to an example embodiment of the inventive concepts.

For example, FIGS. 11A through 25A and FIGS. 11B through 25B are provided to describe a method of manufacturing the semiconductor device 100 of FIGS. 1 through 3. FIGS. 11B through 25B are cross-sectional views cut along lines X1-X1', Y1-Y1', and Y2-Y2' of FIGS. 11A through 25A. In FIGS. 11A through 25A and FIGS. 11B through 25B, the same reference numerals as in FIGS. 1 through 3 denote the same members. In FIGS. 11B through 25B, for convenience, the substrate 100 of FIGS. 2 and 3 and the lower insulating layer 102 of FIGS. 2 and 3 are not shown.

Figure 11A:
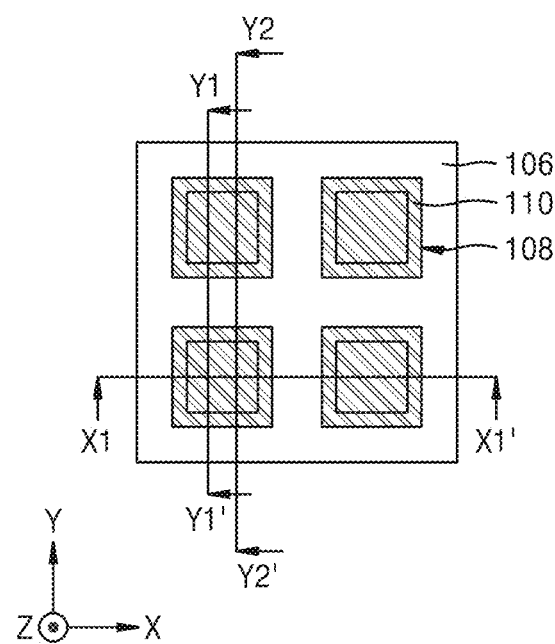
Figure 11B:
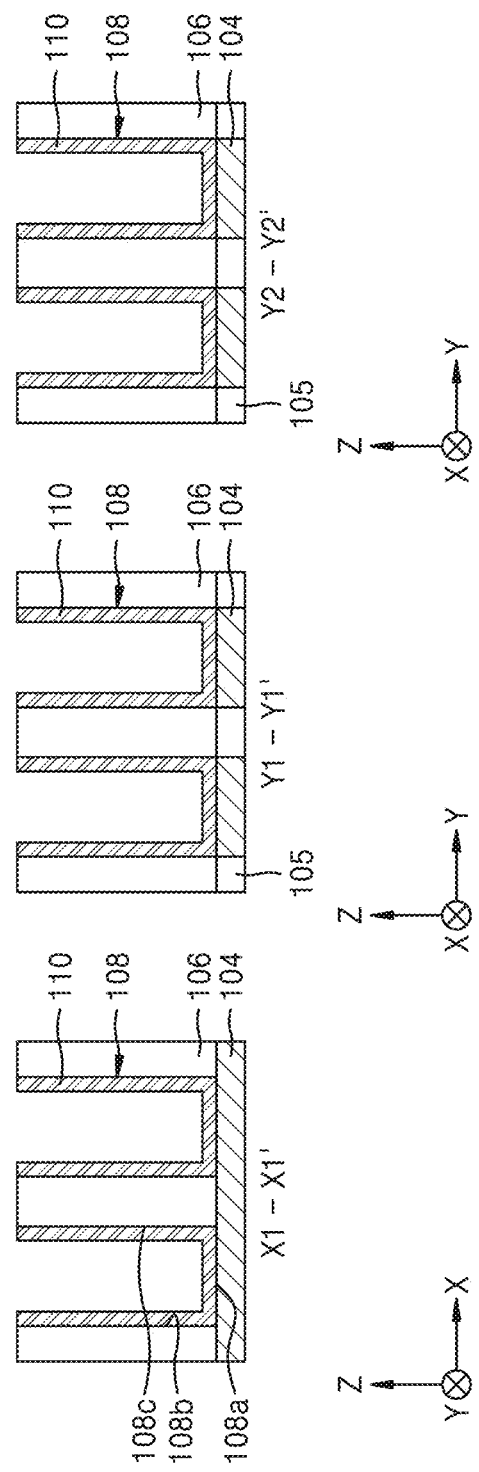

Referring to FIGS. 11A and 11B, the first conductive line 104 may be formed to extend in the first direction (the X direction) and to be apart in the second direction (the Y direction), on the lower insulating layer 102 of FIGS. 2 and 3 on the substrate 100 of FIGS. 2 and 3. The first conductive line 104 may be separated by the insulating pattern 105.

On the first conductive line 104 and the insulating pattern 105, a device isolation insulating material layer (not shown) may be formed and then patterned to form the device isolation trench 108. The device isolation trench 108 may be formed in the device isolation insulating layer 106. The device isolation trench 108 may include the bottom 108a, the one side surface 108b, and the other side surface 108c.

Inside the device isolation trench 108, a first channel material layer 110 may be formed. The first channel material layer 110 may be formed on the bottom 108a, the side surface 108b, and the other side surface 108c of the device isolation trench 108.

Figure 12A:
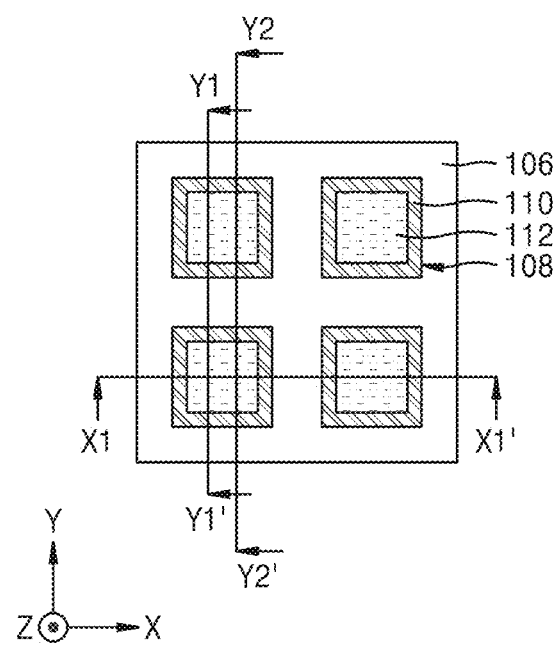
Figure 12B:
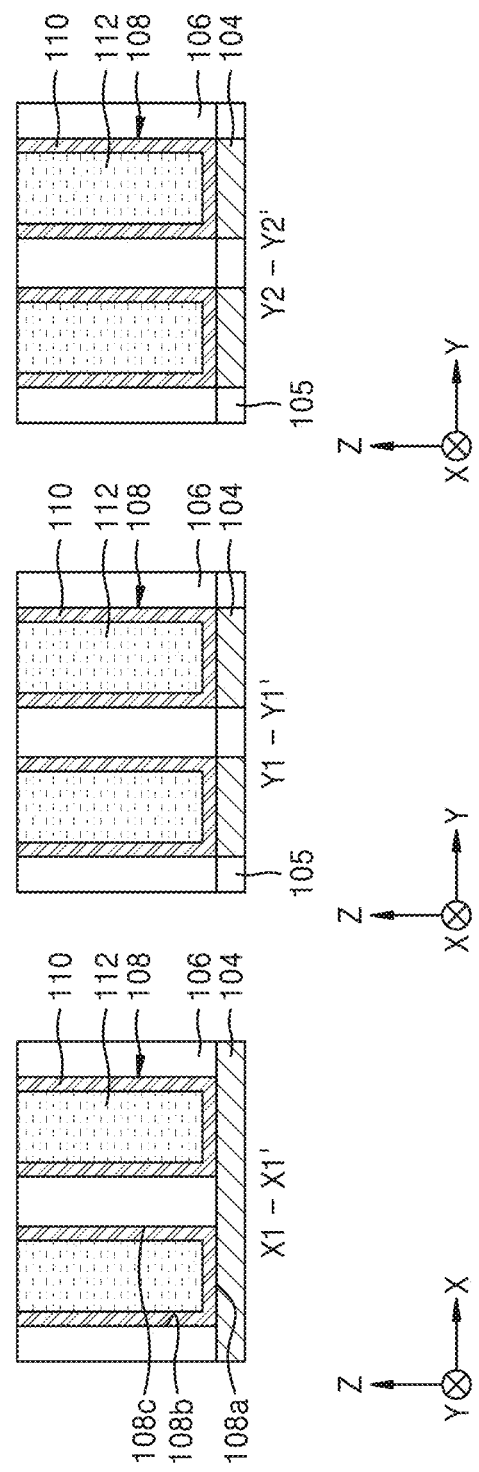

Referring to FIGS. 12A, 12B, 13A, and 13B, as shown in FIGS. 12A and 12B, a buried insulating layer 112 filling the inside of the device isolation trench 108 may be formed on the first channel material layer 110. The buried insulating layer 112 may be an insulating layer having an etch selectivity to the first channel material layer 110. The buried insulating layer 112 may include a silicon nitride layer.

Figure 13A:
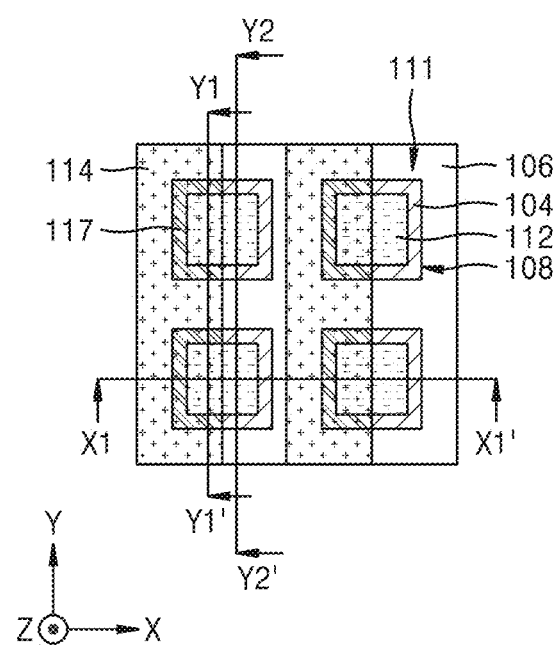
Figure 13B:
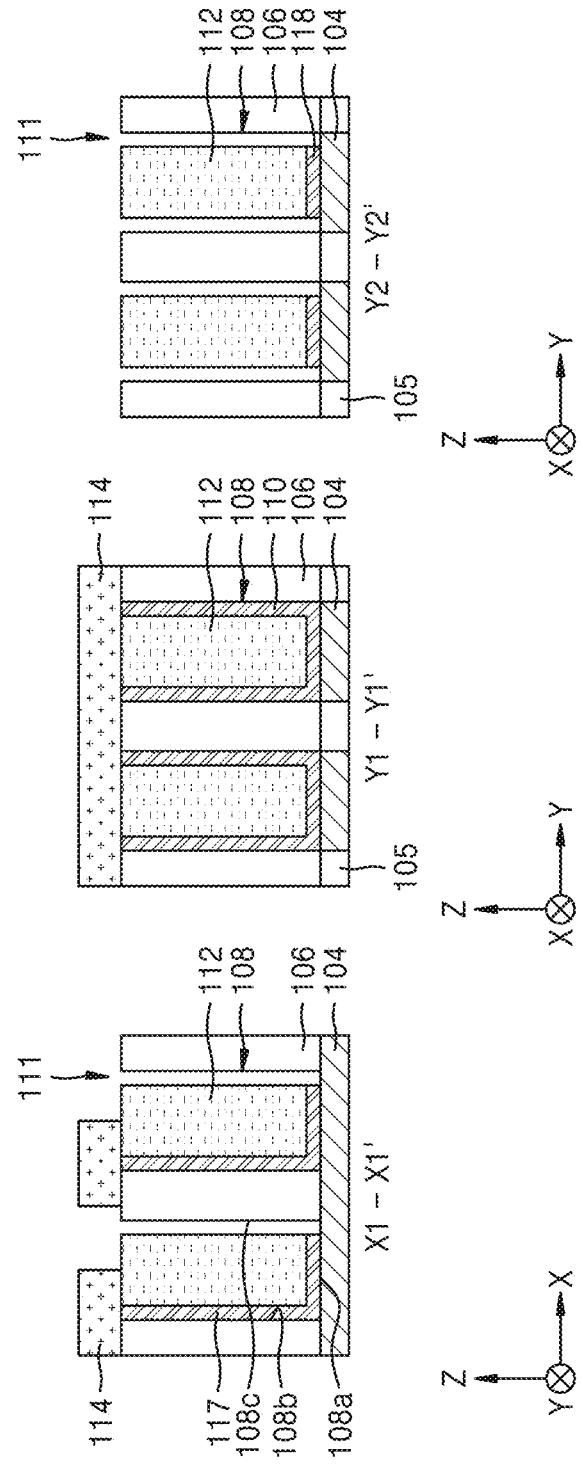

As shown in FIGS. 13A and 13B, a first mask pattern 114 may be formed on the buried insulating layer 112 and the first channel material layer 110 that are buried in the device isolation trench 108. The first mask pattern 114 may be formed on a portion of the first channel material layer 110 that is formed on the side surface 108b of the device isolation trench 108, and may not be formed on another portion of the first channel material layer 110 that is formed on the other side surface 108c of the device isolation trench 108.

Then, the first channel material layer 110 on the other side surface 108c of the device isolation trench 108 may be etched using the first mask pattern 114 as an etch mask, thus forming a first contact hole 111 that exposes the first conductive line 104 in the device isolation trench 108. As the first contact hole 111 is formed, a first channel material pattern 117 may be formed on an X1-X1' cross-section and a second channel material pattern 118 may be formed on a Y2-Y2' cross-section, on the first channel material layer 110.

Figure 14A:
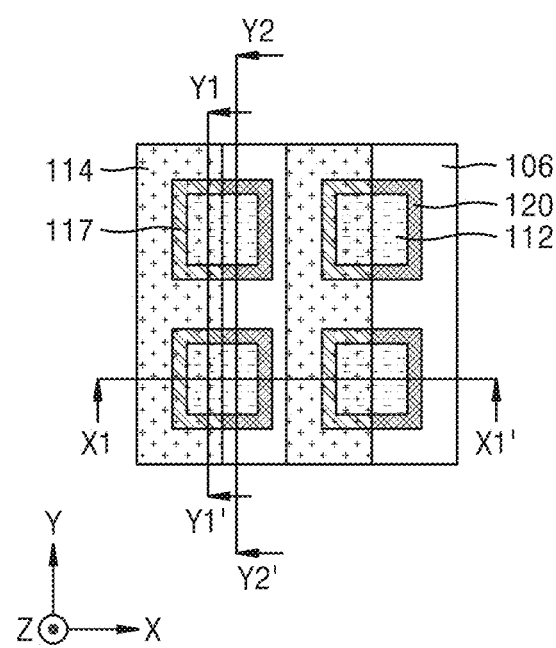

Referring to FIGS. 14A, 14B, 15A, and 15B, as shown in FIGS. 14A and 14B, a first source/drain material layer 120 may be formed in the first contact hole 111. The first source/drain material layer 120 may be formed to fill the first contact hole 111.

Figure 15A:
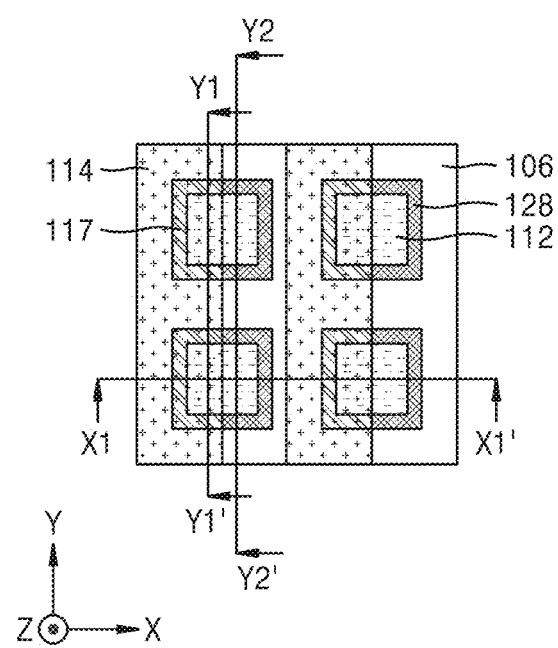
Figure 15B:
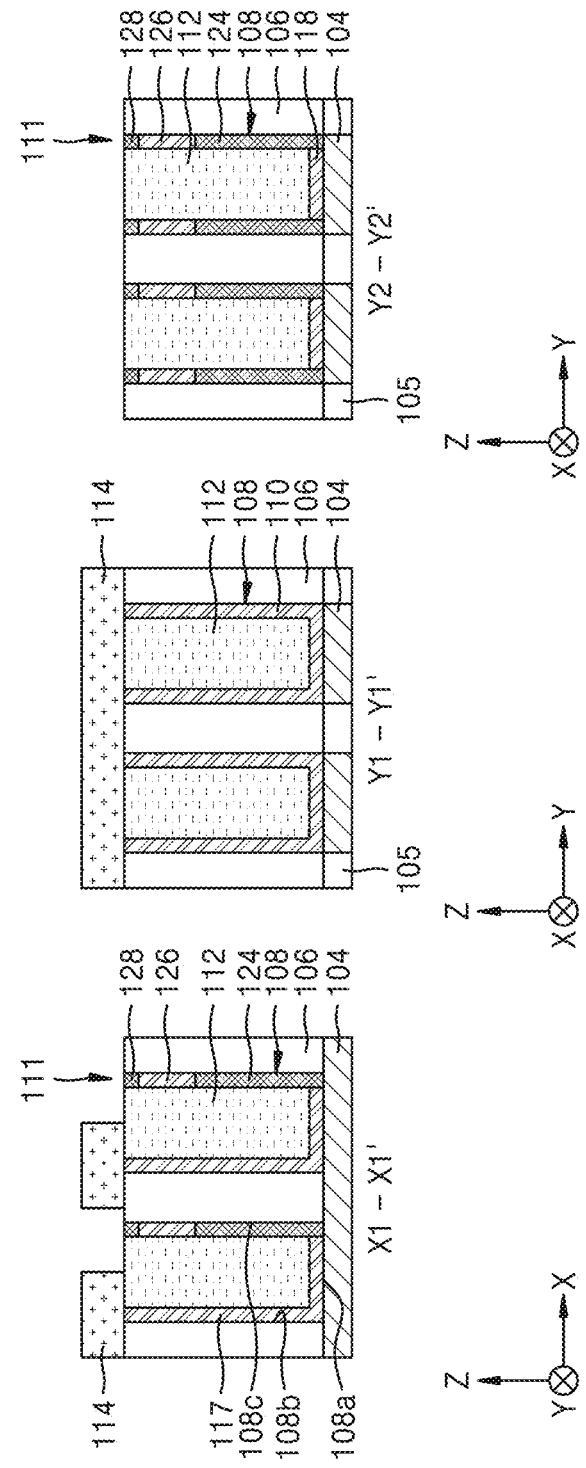

As shown in FIGS. 15A and 15B, the first source/drain material layer 120 in the first contact hole 111 may be partially etched to form the first source/drain region 124. On the first source/drain region 124 in the first contact hole 111, the second channel layer 126 and the second source/drain region 128 may be formed.

Figure 16A:
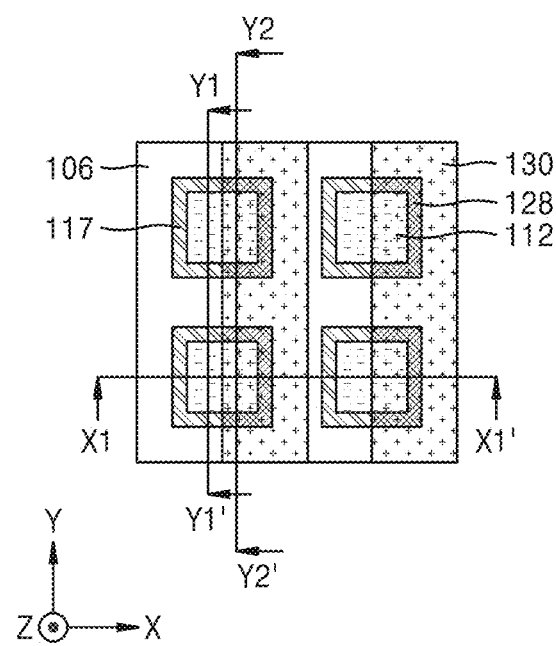
Figure 16B:
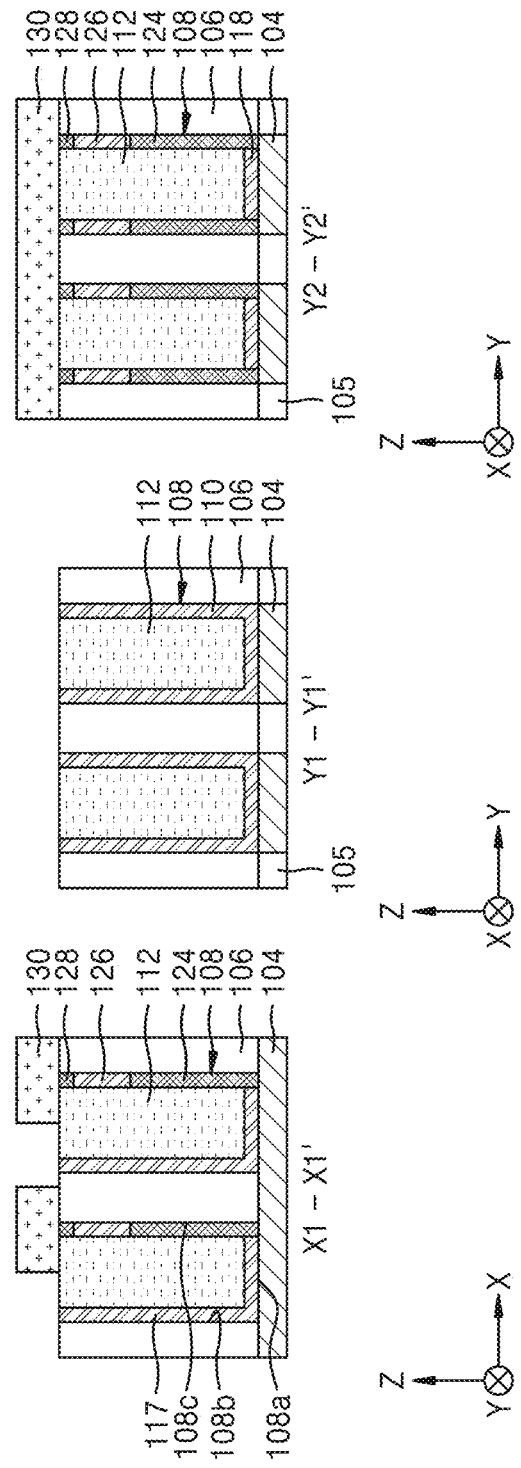

Referring to FIGS. 16A, 16B, 17A, and 17B, as shown in FIGS. 16A and 16B, after the first mask pattern 114 of FIGS. 15A and 16B is removed, a second mask pattern 130 may be formed on the second source/drain region 128. The second mask pattern 130 may be formed on the second source/drain region 128 of the other side surface 108c of the device isolation trench 108.

Figure 17A:
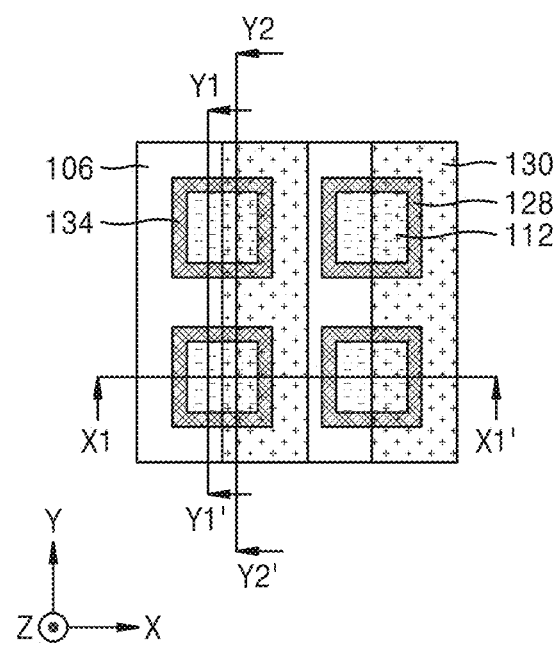
Figure 17B:
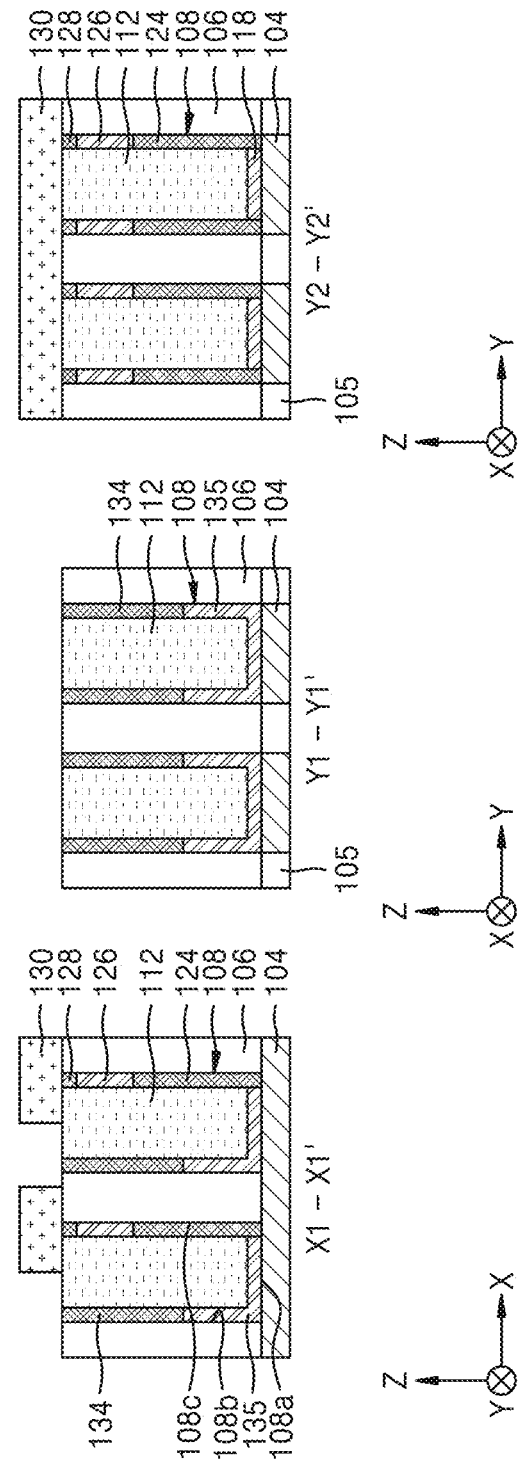

As shown in FIGS. 17A and 17B, the first channel material pattern 117 of the side surface 108b of the device isolation trench 108 may be partially etched using the second mask pattern 130 as an etch mask, thus forming the first channel layer 135. Next, the third source/drain region 134 may be formed on the first channel layer 135 of the side surface 108b of the device isolation trench 108. On the Y1-Y1' cross-section, the first channel layer 135 and the third source/drain region 134 may be formed.

Figure 18A:
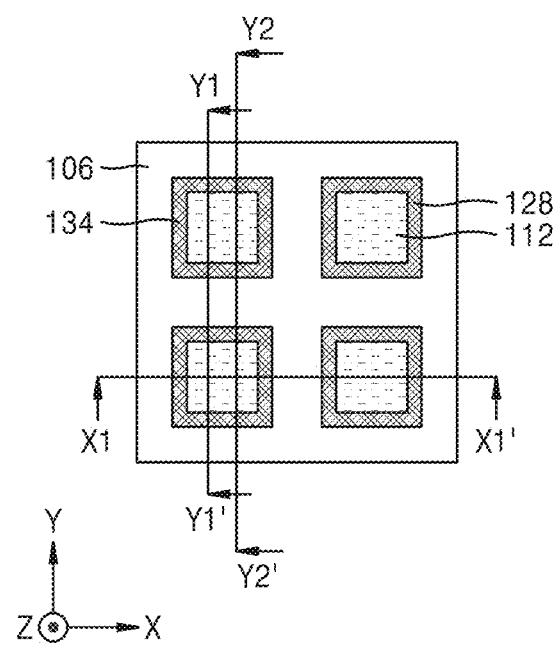
Figure 18B:
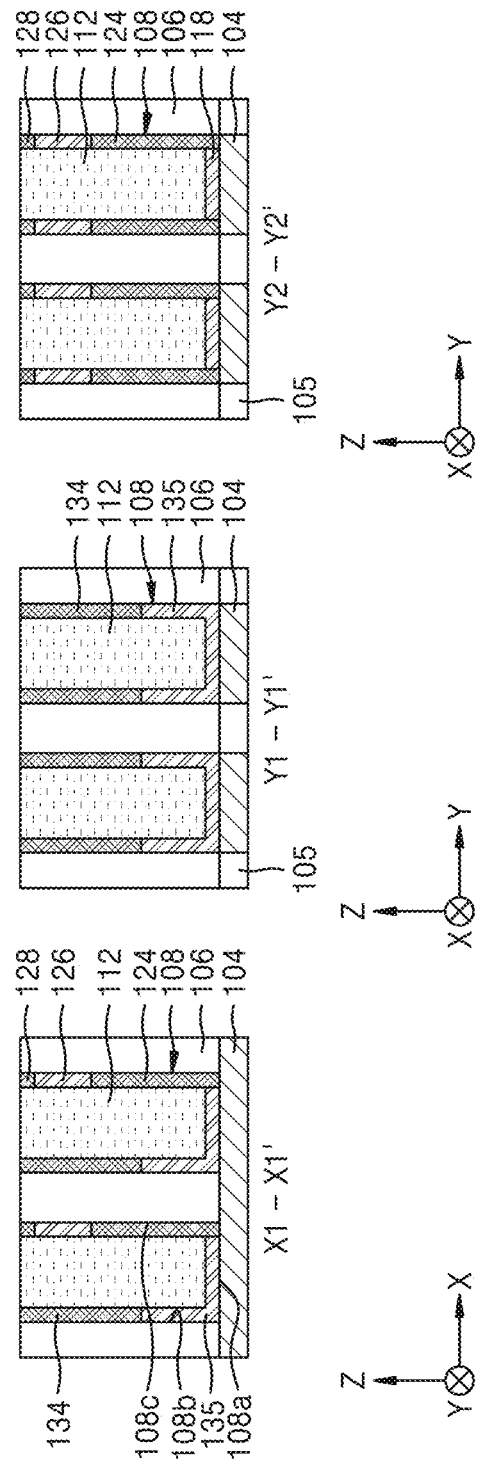
Figure 19A:
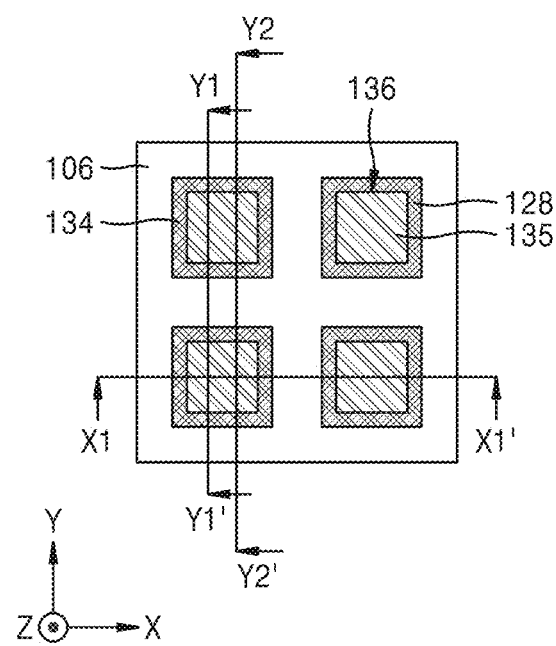
Figure 19B:
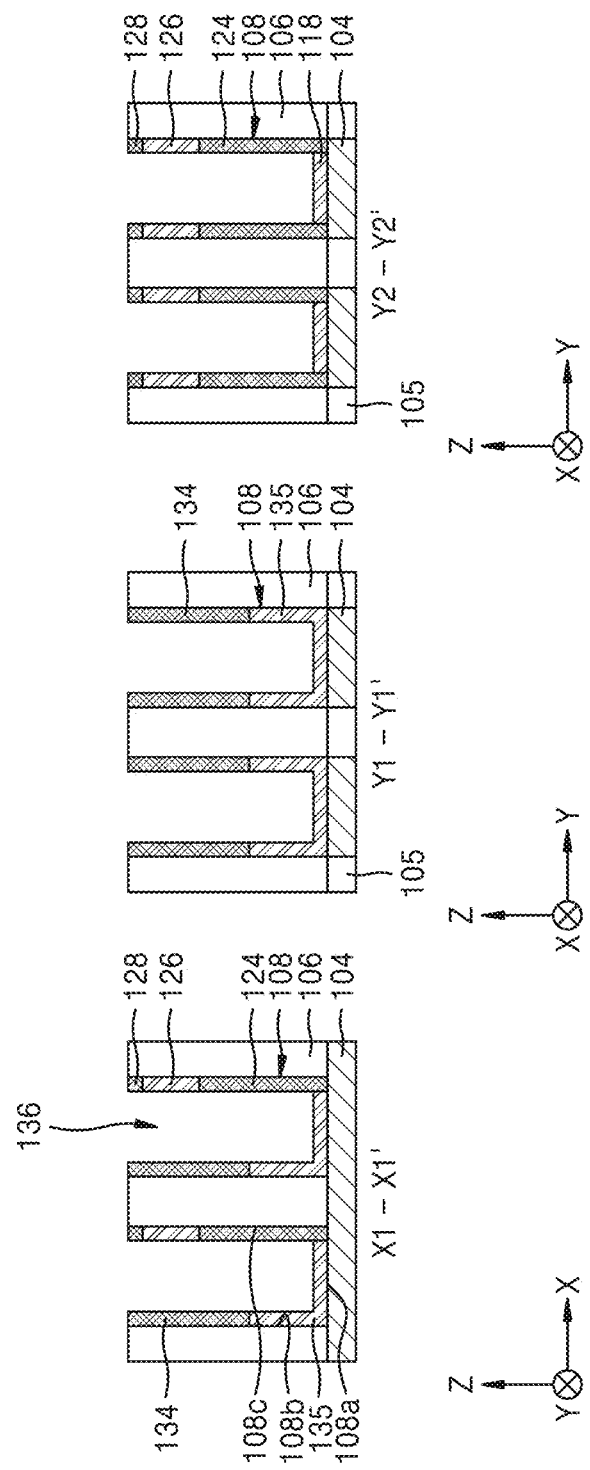

Referring to FIGS. 18A, 18B, 19A, and 19B, as shown in FIGS. 18A and 18B, the second mask pattern 130 may be removed. As shown in FIGS. 19A and 19B, the buried insulating layer 112 formed in the device isolation trench 108 may be removed. As the buried insulating layer 112 is removed, the first channel layer 135, the first source/drain region 124, the second channel layer 126, the second source/drain region 128, and the third source/drain region 134 may be formed in the device isolation trench 108.

Figure 20A:
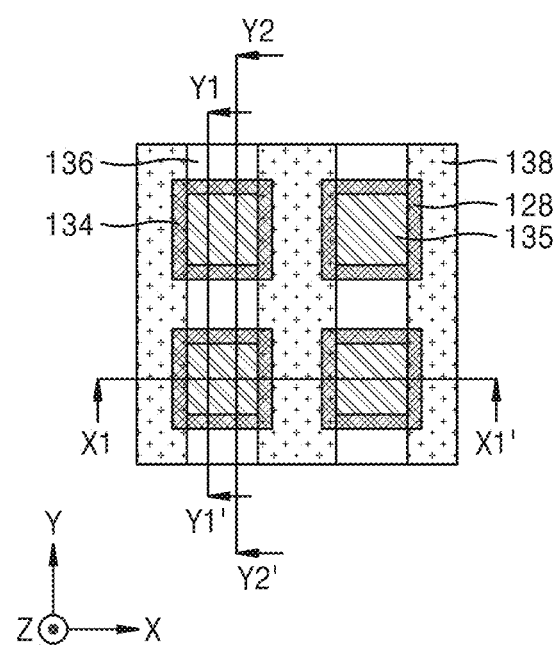
Figure 20B:
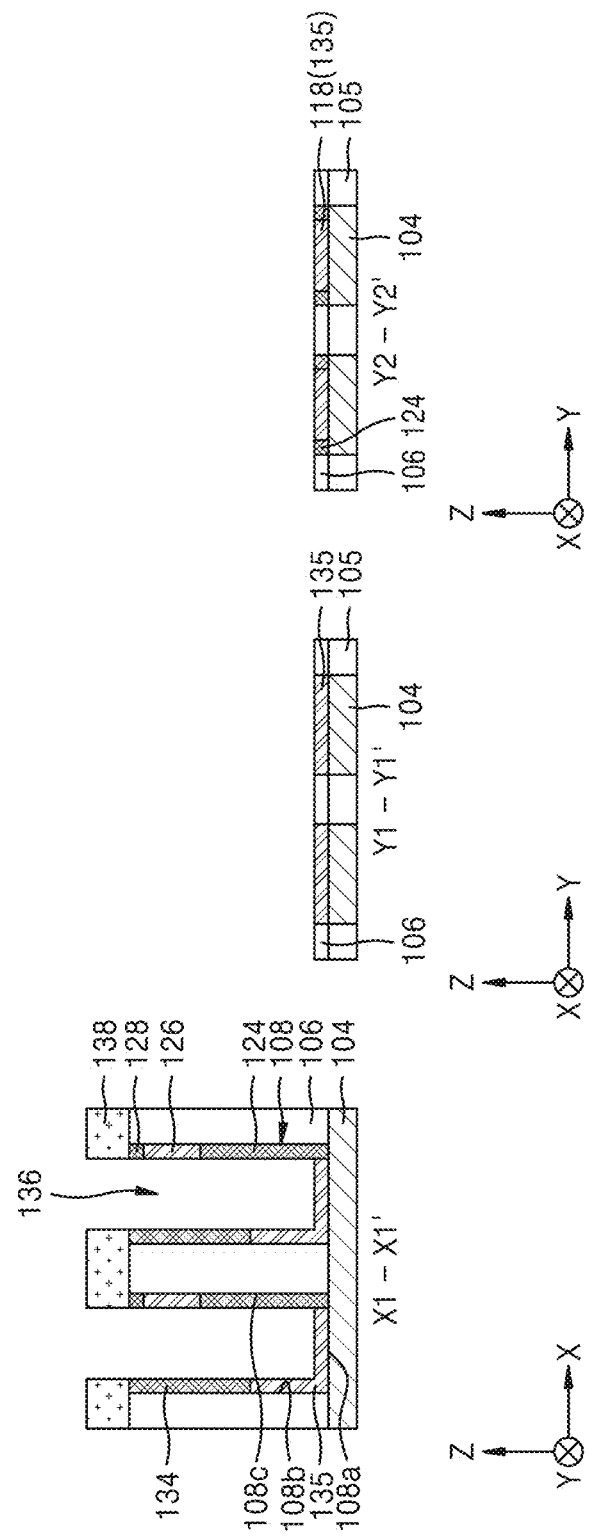

Referring to FIGS. 20A, 20B, 21A, and 21B, as shown in FIGS. 20A and 20B, a third mask pattern 138 may be formed on the second source/drain region 128, the device isolation insulating layer 106, and the third source/drain region 134 of the X1-X1' cross-section.

Next, the third source/drain region 134, a portion of the first channel layer 135, and a portion of the device isolation insulating layer 106 on the Y1-Y1' cross-section may be etched by using the third mask pattern 138 as an etch mask. Thus, the first channel layer 135 may remain on the first conductive line 104.

In addition, the second source/drain region 128, the second channel layer 126, a portion of the first source/drain region 124, and a portion of the device isolation insulating layer 106 on the Y2-Y2' cross-section may be etched by using the third mask pattern 138 as an etch mask. Thus, the first channel material pattern 118 and the first source/drain region 124 may remain on the first conductive line 104. The first channel material pattern 118 may be the first channel layer 135.

Figure 21A:
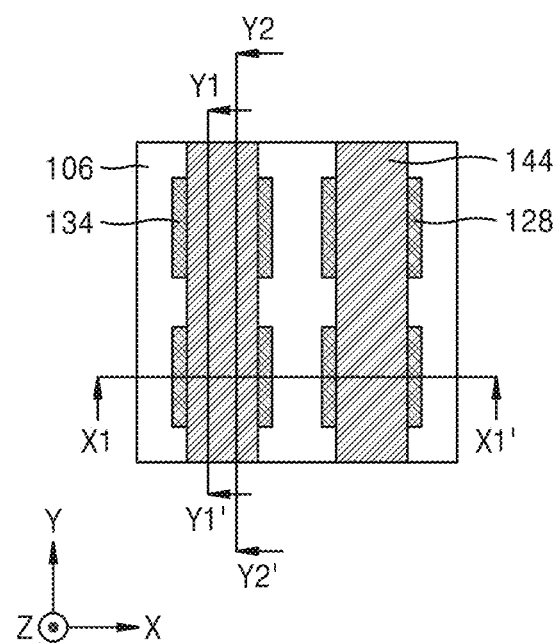
Figure 21B:
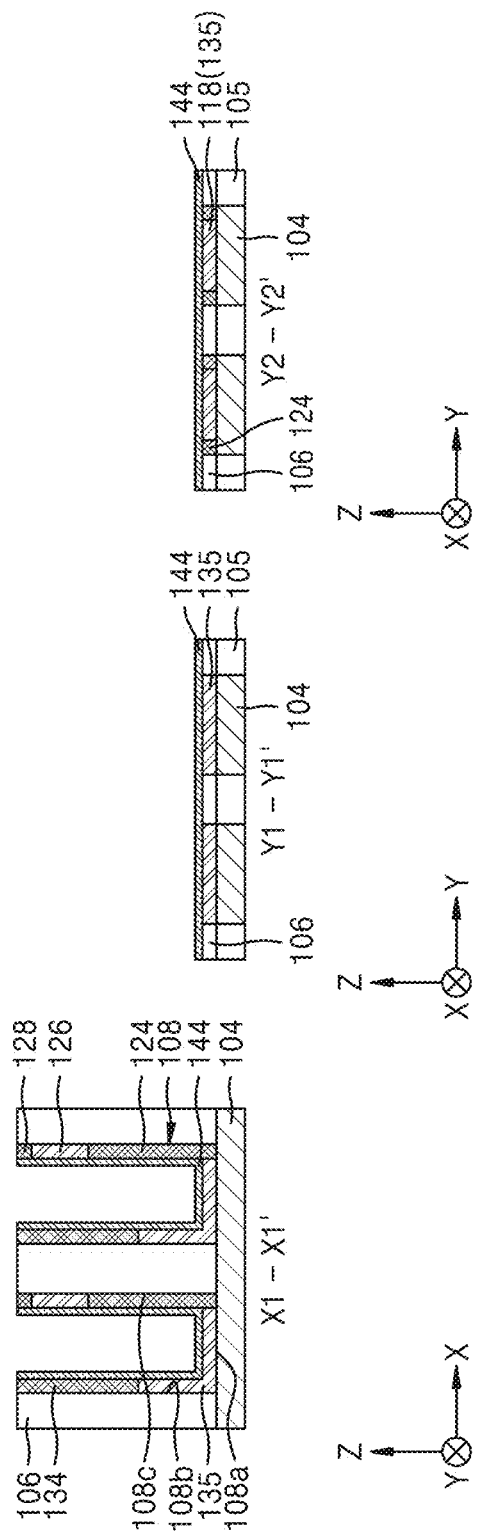
Figure 22A:
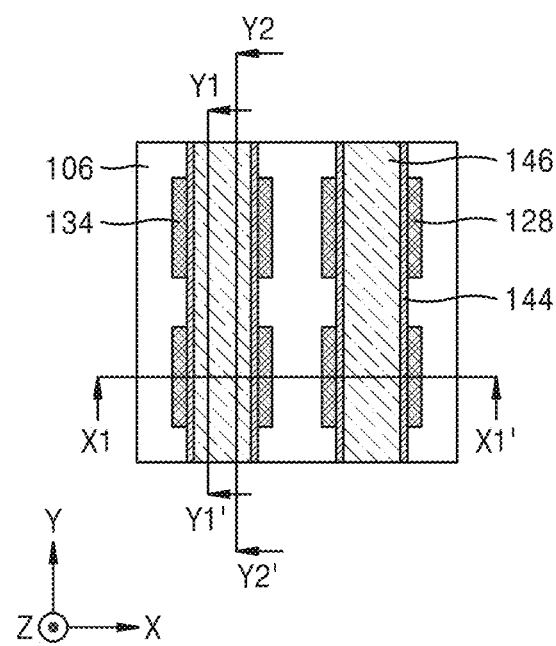
Figure 22B:
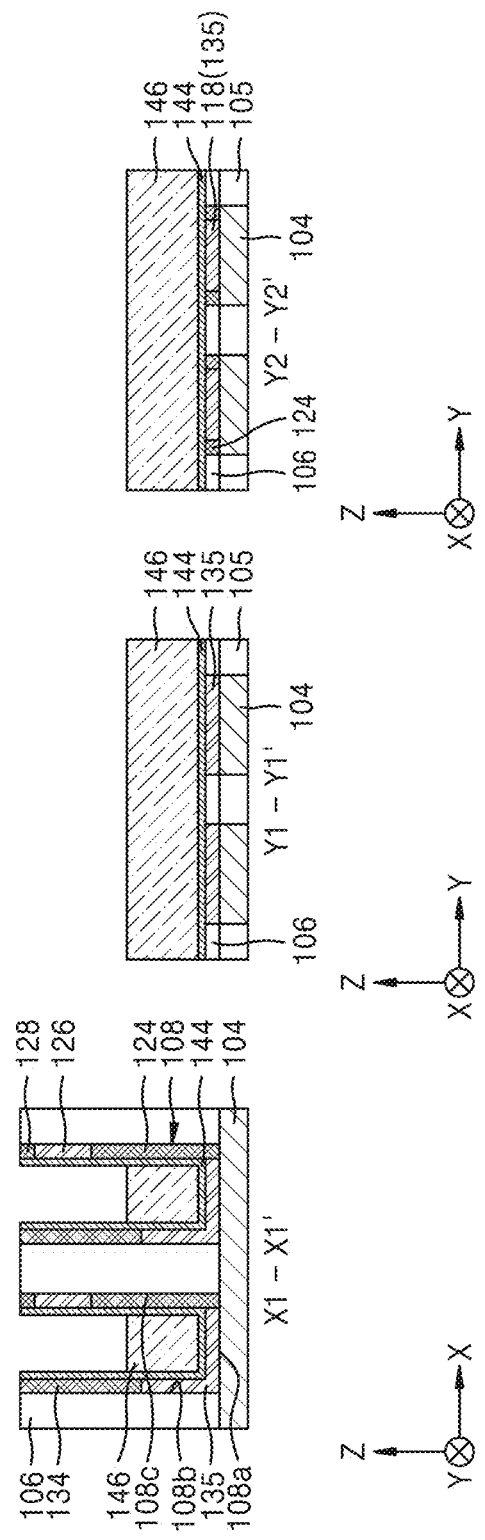

As shown in FIGS. 21A and 21B, after the third mask pattern 138 is removed, the gate insulating layer 144 may be formed inside the device isolation trench 108. The gate insulating layer 144 may be formed on the first channel layer 135, the first source/drain region 124, the second channel layer 126, the second source/drain region 128, and the third source/drain region 134 inside the device isolation trench 108.

Referring to FIGS. 22A, 22B, 23A, and 23B, the first gate electrode 146 may be formed on the gate insulating layer 144 inside the device isolation trench 108. The first gate electrode 146 may be formed on the gate insulating layer 144 on the Y1-Y1' cross-section and the Y2-Y2' cross-section.

Figure 23A:
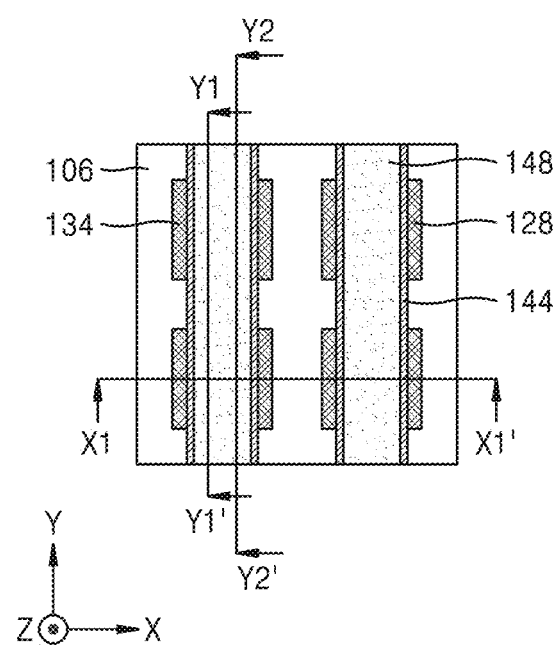
Figure 23B:
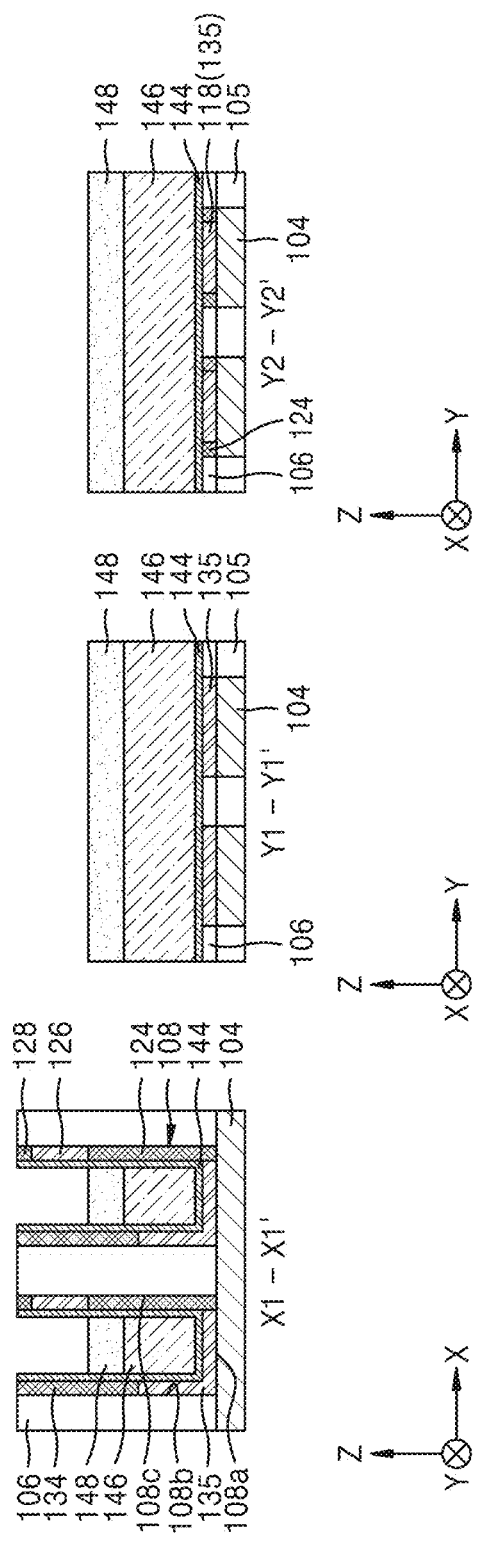
Figure 24A:
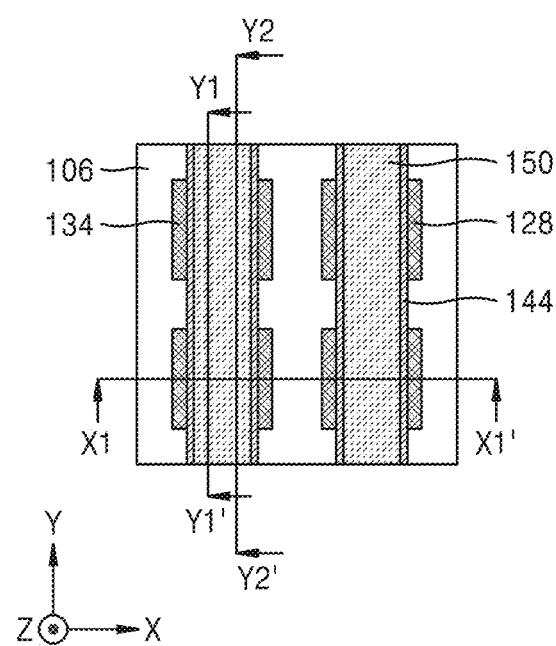
Figure 24B:
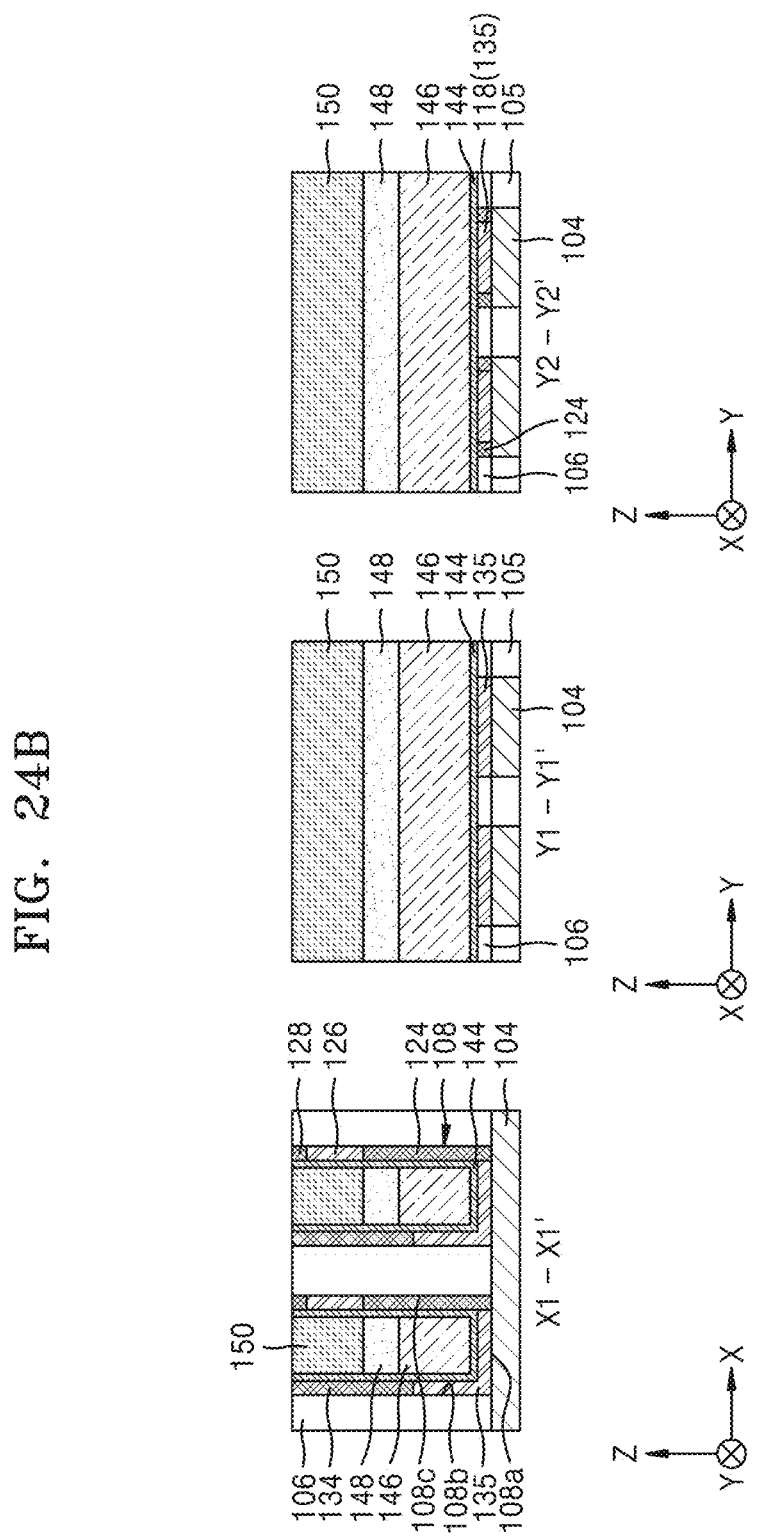

As shown in FIGS. 23A and 23B, the gate isolation insulating layer 148 may be formed on the first gate electrode 146 inside the device isolation trench 108. The gate isolation insulating layer 148 may be formed on the first gate electrode 146 on the Y1-Y1' cross-section and the Y2-Y2' cross-section.

Referring to FIGS. 24A, 24B, 25A, and 25B, the second gate electrode 150 may be formed on the gate isolation insulating layer 148 inside the device isolation trench 108. The second gate electrode 150 may be formed on the first gate electrode 146 on the Y1-Y1' cross-section and the Y2-Y2' cross-section.

Figure 25A:
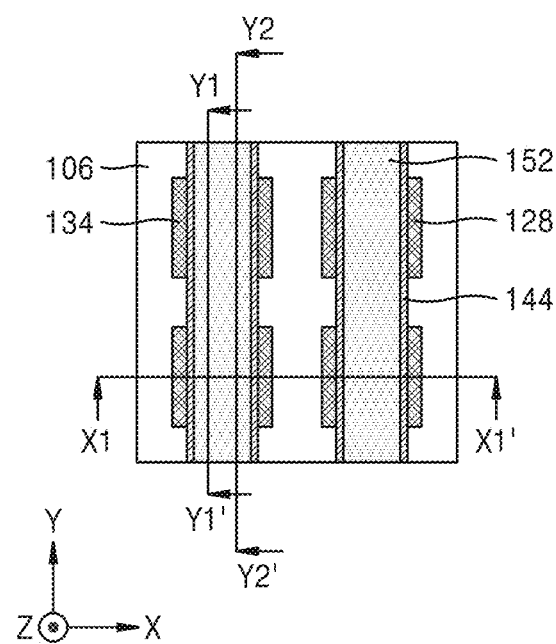
Figure 25B:
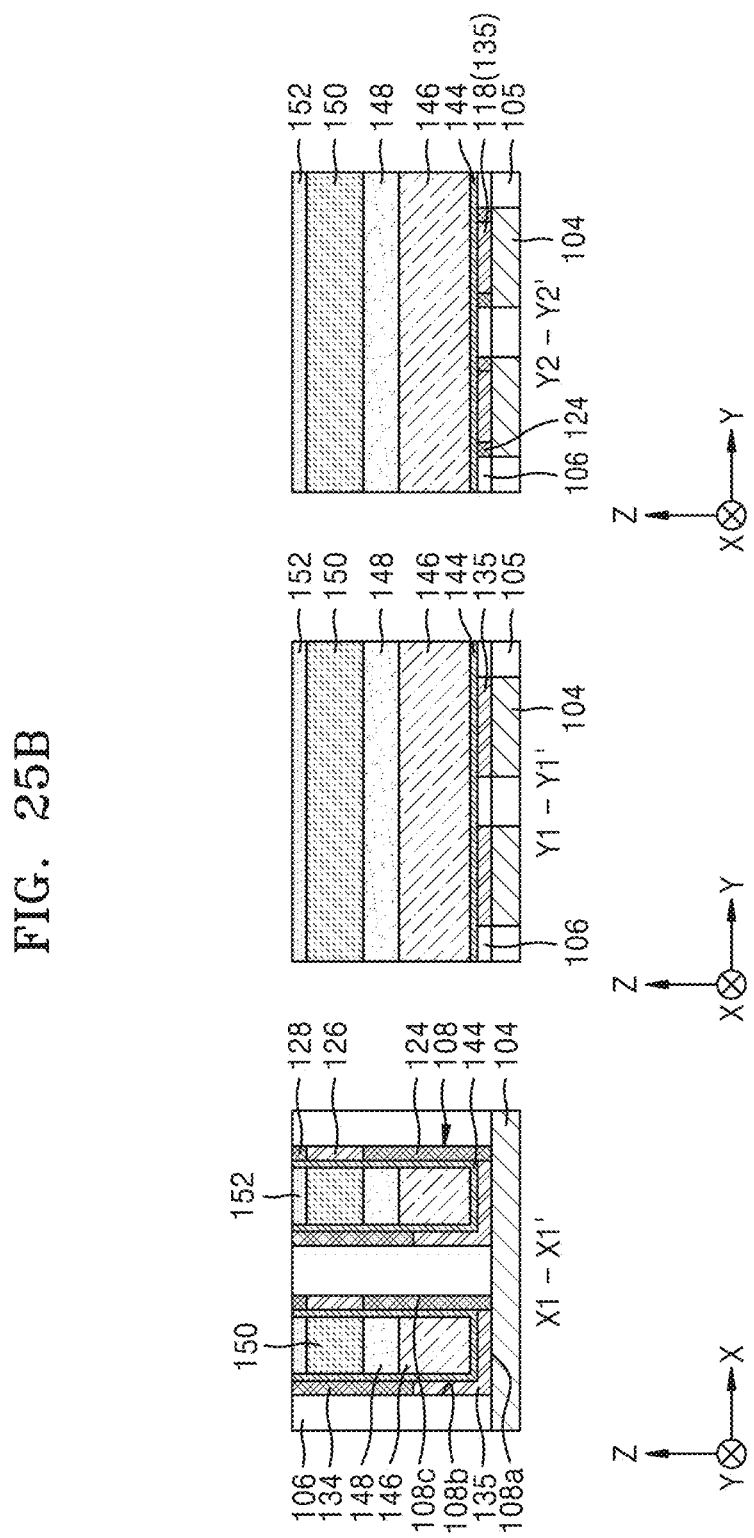

As shown in FIGS. 25A and 25B, a gate cap layer 152 may be formed on the second gate electrode 150 inside the device isolation trench 108. The gate cap layer 152 may be formed on the second gate electrode 150 on the Y1-Y1' cross-section and the Y2-Y2' cross-section.

Figure 26:
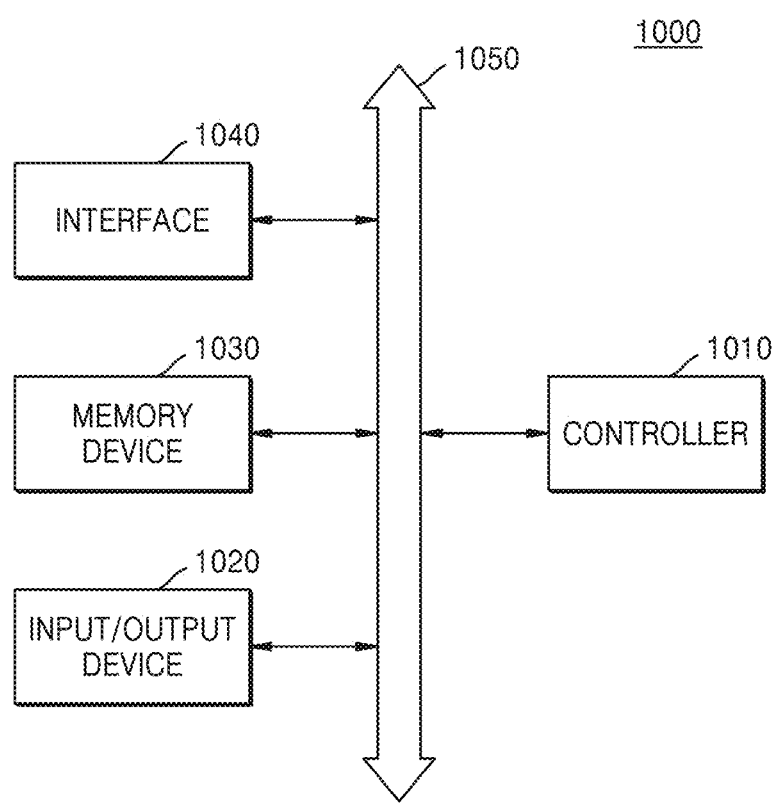
FIG. 26 is a block diagram of an electronic system including a semiconductor device according to an example embodiment of the inventive concepts.

FIG. 26 is a block diagram of an electronic system including a semiconductor device according to an example embodiment of the inventive concepts.

For example, an electronic system 1000 may include a controller 1010, an input/output device 1020, a memory 1030 (or a memory device), and an interface 1040. The electronic system 1000 may be a mobile system or a system that transmits or receives information. In some example embodiments, the mobile system may include a personal digital assistant (PDA), a portable computer, a web tablet, a wireless phone, a mobile phone, a digital music player, or a memory card.

The controller 1010 to control an execution program in the electronic system 1000 may include a microprocessor, a digital signal processor, a microcontroller, or a device that is similar thereto. The input/output device 1020 may be used to input or output data of the electronic system 1000. The electronic system 1000 may be connected to an external device, e.g., a personal computer or a network, and exchange data with the external device, by using the input/output device 1020. The input/output device 1020 may be, for example, a keypad, a keyboard, or a display.

The memory device 1030 may store code and/or data for an operation of the controller 1010 or data processed in the controller 1010. The memory device 1030 may include the semiconductor devices 100, 100-1, 100-2, and 100-3 according to the inventive concepts. The interface 1040 may be a data transmission path between the electronic system 1000 and an external another device. The controller 1010, the input/output device 1020, the memory device 1030, and the interface 1040 may communicate with one another through a bus 1050.

The electronic system 1000 according to the current example embodiment may be used in, for example, a mobile phone, an MP3 player, a navigation, a portable multimedia player (PMP), a solid-state disk (SSD), or a household appliance.

Any functional blocks shown in the figures and described above may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to some example embodiments thereof, it will be understood that various changes in form and details may be made therein without departing from the spirit and scope of the following claims.

What is claimed is:

1. A semiconductor device comprising:
   a conductive line on a substrate;
   a first gate electrode on the conductive line;
   a second gate electrode on the first gate electrode, the second gate electrode separated from the first gate electrode by a gate isolation insulating layer;
   a first channel layer on a first side surface of the first gate electrode, with a first gate insulating layer interposed therebetween;
   a first source/drain region on a second side surface of the first gate electrode;
   a second channel layer on a third side surface of the second gate electrode with a second gate insulating layer interposed therebetween, the third side surface being opposite to the first side surface;
   a second source/drain region on the second channel layer; and
   a third source/drain region on the first channel layer and on a fourth side surface of the second gate electrode, the fourth side surface being on a same side as the first channel layer.

2. The semiconductor device of claim 1, wherein
   the first gate electrode, the first gate insulating layer, the first channel layer, and the third source/drain region constitute a first vertical channel transistor, and
   the second gate electrode, the second gate insulating layer, the second channel layer, the first source/drain region, and the second source/drain region constitute a second vertical channel transistor.

3. The semiconductor device of claim 1, wherein
   the first channel layer and the second channel layer comprise an oxide semiconductor layer, and
   the first source/drain region, the second source/drain region, and the third source/drain region comprise a conductive layer.

4. The semiconductor device of claim 1, further comprising:
   a shielding conductive layer inside the gate isolation insulating layer.

5. The semiconductor device of claim 1, wherein the gate isolation insulating layer includes an air layer.

6. The semiconductor device of claim 1, wherein the second gate electrode is apart from the first gate electrode in an extension direction of the conductive line.

7. The semiconductor device of claim 1, wherein
   the first side surface of the first gate electrode and the fourth side surface of the second gate electrode are on a first vertical plane in a direction perpendicular to a surface of the substrate, and
   the second side surface of the first gate electrode and the third side surface of the second gate electrode are on a second vertical plane in the direction perpendicular to the surface of the substrate.

8. The semiconductor device of claim 1, wherein the first source/drain region is on the second side surface of the first gate electrode, with the first gate insulating layer interposed therebetween.

9. The semiconductor device of claim 1, wherein the third source/drain region is on the fourth side surface of the second gate electrode, with the second gate insulating layer interposed therebetween.

10. The semiconductor device of claim 1, further comprising:
    a gate cap layer on the second gate electrode,
    wherein a first top surface of the second source/drain region and a second top surface of the gate cap layer are coplanar.

11. The semiconductor device of claim 1, further comprising:
    a lower electrode of a capacitor structure on both the second source/drain region and the third source/drain region.

12. A semiconductor device comprising:
    a conductive line on a substrate;
    a first gate electrode in a device isolation trench on the conductive line;
    a second gate electrode on the first gate electrode in the device isolation trench, the second gate electrode separated from the first gate electrode by a gate isolation insulating layer;
    a first channel layer on a bottom surface and a first isolation side surface of the device isolation trench, the first channel layer being on a first gate side surface of the first gate electrode with a first gate insulating layer interposed therebetween;
    a first source/drain region on a second isolation side surface of the device isolation trench and the first source/drain region being on a second gate side surface of the first gate electrode;
    a second channel layer on the second isolation side surface of the device isolation trench, the second channel layer being on a third gate side surface of the second gate electrode with a second gate insulating layer interposed therebetween, the third gate side surface being 1 opposite side to the first gate side surface;

a second source/drain region on the second isolation side surface of the device isolation trench and on the second channel layer; and a third source/drain region on the first isolation side surface of the device isolation trench, the third source/drain region being on a fourth gate side surface of the second gate electrode, the fourth gate side surface being on a same side as the first channel layer, and the third source/drain region being on the first channel layer.

13. The semiconductor device of claim 12, further comprising:
a device isolation insulating layer on the conductive line and including the device isolation trench.

14. The semiconductor device of claim 12, wherein the first channel layer is on a portion of a bottom isolation surface of the device isolation trench and on a portion of the second isolation side surface of the device isolation trench.

15. The semiconductor device of claim 12, wherein the first gate insulating layer and the second gate insulating layer are an integral body.

16. The semiconductor device of claim 12, wherein
the first channel layer and the second channel layer comprise an oxide semiconductor layer, and
the first source/drain region, the second source/drain region, and the third source/drain region comprise a conductive layer.

17. A semiconductor device comprising:
a first conductive line extending in a first direction on a substrate;
a second conductive line on the first conductive line and extending in a second direction perpendicular to the first direction, the second conductive line comprising a first sub-gate line and a second sub-gate line, the first sub-gate line comprising a first gate electrode, the second sub-gate line comprising a second gate electrode, the second gate electrode separated from the first gate electrode by a gate isolation insulating layer;
a first vertical channel transistor on a first side of the second conductive line; and
a second vertical channel transistor on a second side of the second conductive line,
wherein the first vertical channel transistor comprises a first channel layer on a first gate side surface of the first gate electrode with a first gate insulating layer interposed therebetween, a third source/drain region on the first channel layer and on a first gate side surface of the second gate electrode, the first gate side surface of the second gate electrode being on a same side as the first channel layer, and
the second vertical channel transistor comprises a second channel layer on a second gate side surface of the second gate electrode with a second gate insulating layer interposed therebetween, the second gate side surface of the second gate electrode being opposite to the first channel layer, a first source/drain region on a second gate side surface of the first gate electrode, and a second source/drain region on the second channel layer.

18. The semiconductor device of claim 17, wherein the first conductive line comprises a bit line and the second conductive line comprises a word line.

19. The semiconductor device of claim 17, wherein
the first channel layer and the second channel layer comprise an oxide semiconductor layer, and
the first source/drain region, the second source/drain region, and the third source/drain region comprise a conductive layer.

20. The semiconductor device of claim 17, further comprising:
a shielding conductive line between the first sub-gate line and the second sub-gate line and inside the gate isolation insulating layer.

* * * * *